US012650811B2

(12) United States Patent
Agrawal et al.

(10) Patent No.: US 12,650,811 B2
(45) Date of Patent: Jun. 9, 2026

(54) MIXED SIGNAL CIRCUITRY FOR BITWISE MULTIPLICATION WITH DIFFERENT ACCURACIES

(71) Applicant: International Business Machines Corporation, Armonk, NY (US)

(72) Inventors: Ankur Agrawal, Chappaqua, NY (US); Mingu Kang, Old Tappan, NJ (US); Kyu-Hyoun Kim, Chappaqua, NY (US); Monodeep Kar, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 1109 days.

(21) Appl. No.: 17/474,843

(22) Filed: Sep. 14, 2021

(65) Prior Publication Data

US 2023/0083270 A1 Mar. 16, 2023

(51) Int. Cl.
| | |
|---|---|
| *G06F 7/544* | (2006.01) |
| *G06F 7/50* | (2006.01) |
| *G06F 7/523* | (2006.01) |
| *H03M 1/38* | (2006.01) |

(52) U.S. Cl.
CPC ............. *G06F 7/5443* (2013.01); *G06F 7/50* (2013.01); *G06F 7/523* (2013.01); *H03M 1/38* (2013.01)

(58) Field of Classification Search
CPC .......... G06F 7/5443; G06F 7/50; G06F 7/523; H03M 1/38
See application file for complete search history.

(56) References Cited

U.S. PATENT DOCUMENTS

| | | | |
|---|---|---|---|
| 6,233,597 B1 | 5/2001 | Tanoue et al. | |
| 8,959,137 B1* | 2/2015 | Langhammer | ........ G06F 7/5324 |
| | | | 708/622 |
| 9,356,615 B1* | 5/2016 | Ranjbar | .............. H03M 1/1023 |
| 10,389,375 B1 | 8/2019 | Fick et al. | |
| 10,552,154 B2 | 2/2020 | Madduri et al. | |

(Continued)

FOREIGN PATENT DOCUMENTS

| | | |
|---|---|---|
| CN | 109683961 A | 4/2019 |
| CN | 111144558 A | 5/2020 |

(Continued)

OTHER PUBLICATIONS

Ghodrati, S. (Oct. 3, 2020). Mixed-Signal Charge-Domain Acceleration of Deep Neural Networks through Interleaved Bit-Partitioned Arithmetic. https://jongse-park.github.io/files/paper/2020-pact-bihiwe.pdf (Year: 2020).*

(Continued)

*Primary Examiner* — Andrew Caldwell
*Assistant Examiner* — Carlos Heberto De La Garza
(74) *Attorney, Agent, or Firm* — Kimberly Zillig; Ryan, Mason & Lewis, LLP

(57) ABSTRACT

An apparatus comprises at least one processor and at least one memory including instruction code configured to, with the at least one processor, cause the apparatus at least to perform, with a first accuracy, a first portion of a bitwise multiplication of first and second digital inputs and to perform, with a second accuracy different than the first accuracy, at least a second portion of the bitwise multiplication.

17 Claims, 13 Drawing Sheets

(56) References Cited

U.S. PATENT DOCUMENTS

| | | | |
|---|---|---|---|
| 10,621,269 B2 | 4/2020 | Phelps et al. | |
| 10,637,495 B2 | 4/2020 | Shen et al. | |
| 10,848,167 B1* | 11/2020 | Far | H03M 1/0863 |
| 11,809,837 B2 | 11/2023 | Agrawal et al. | |
| 2004/0228424 A1 | 11/2004 | Baldwin et al. | |
| 2018/0321938 A1* | 11/2018 | Boswell | G06F 9/3001 |
| 2019/0087356 A1 | 3/2019 | Fick et al. | |
| 2019/0102194 A1 | 4/2019 | Madduri et al. | |
| 2019/0179776 A1 | 6/2019 | Fick et al. | |
| 2019/0196785 A1 | 6/2019 | Danysh et al. | |
| 2020/0127626 A1* | 4/2020 | Paulsen | H03G 3/001 |
| 2020/0150926 A1* | 5/2020 | Connor | G06F 9/3001 |
| 2020/0311183 A1 | 10/2020 | Simpson | |
| 2020/0356344 A1 | 11/2020 | Cruz-Albrecht et al. | |
| 2020/0356620 A1* | 11/2020 | Yen | G06F 17/16 |
| 2020/0364577 A1 | 11/2020 | LeGallo-Bourdeau et al. | |
| 2020/0387564 A1 | 12/2020 | Simpson | |
| 2020/0409659 A1 | 12/2020 | Brunie | |
| 2020/0410333 A1 | 12/2020 | Das et al. | |
| 2021/0005230 A1 | 1/2021 | Wang et al. | |
| 2021/0097131 A1 | 4/2021 | Guo et al. | |
| 2021/0209190 A1* | 7/2021 | Kung | G06F 7/5443 |
| 2022/0215257 A1 | 7/2022 | Shen et al. | |

FOREIGN PATENT DOCUMENTS

| | | | |
|---|---|---|---|
| CN | 111492343 A | 8/2020 | |
| CN | 112130804 A | 12/2020 | |
| CN | 112860220 A | 5/2021 | |
| CN | 113159305 A | 7/2021 | |
| CN | 117980899 A | 5/2024 | |
| DE | 112022004400 T5 | 6/2024 | |
| JP | 2000-181984 A | 6/2000 | |
| JP | 2024-533118 A | 9/2024 | |
| TW | 201905768 A | 2/2019 | |
| TW | 201933786 A | 8/2019 | |
| TW | I818547 B | 10/2023 | |
| WO | 2019100036 A1 | 5/2019 | |
| WO | 2020257531 A1 | 12/2020 | |
| WO | PCT/IB2022/058613 | 11/2022 | |
| WO | 2023/042068 A1 | 3/2023 | |

OTHER PUBLICATIONS

Khaire, D. (Apr. 2014). Design of flash ADC using improved Comparator Scheme. https://www.ijera.com/special_issue/ICIAC_April_2014/EN/V3/EN-1703943.pdf (Year: 2014).*

Nur Zazmera Mustafa Kamal. (May 2020). (PDF) design of low voltage comparator for analog to digital conversion. https://www.researchgate.net/publication/283887116_Design_of_Low_voltage_Comparator_for_Analog_to_Digital_Conversion (Year: 2020).*

Bankman, D. (2017). An 8-bit, 16 input, 3.2 PJ/OP switched-capacitor dot product circuit in 28-NM FDSOI CMOS | IEEE conference publication | IEEE Xplore. https://ieeexplore.ieee.org/document/7844125 (Year: 2017).*

Taiwan Office Action Application No. 11220078060, Jan. 31, 2023, 5 pages.

M. Duppils et al., "Low Power Mixed Analog-Digital Signal Processing," Proceedings of the 2000 International Symposium on Low Power Electronics and Design, Jul. 2000, pp. 61-66.

P. Mell et al., "The NIST Definition of Cloud Computing," Recommendations of the National Institute of Standards and Technology, Special Publication 800-145, Sep. 2011, 7 pages.

U.S. Appl. No. 17/012,916, filed Sep. 4, 2020, and entitled "Integer Matrix Multiplication Based on Mixed Signal Circuits."

International Searching Authority, "Notification of Transmittal of the International Search Report and the Written Opinion of the International Searching Authority, or Declaration," Patent Cooperation Treaty, Nov. 28, 2022, 10 pages, International Application No. PCT/IB2022/058613.

Japan Patent Office, "Notice of Reasons for Refusal" Dec. 23, 2025, 04 Pages, JP Application No. 2024-513738.

\* cited by examiner

100

110

$$R_{out} = \sum_{1}^{64} x_i * w_i \rightarrow R_{out} = \sum_{\substack{m,n \\ 16}} 2^j \sum_{i=0}^{63} x_{i,m} * w_{i,n}$$

$$\sum_{i=1}^{64} X_i W_i = \sum_{i=1}^{64} (8x_{i3} + 4x_{i2} + 2x_{i1} + x_{i0})(8w_{i3} + 4w_{i2} + 2w_{i1} + w_{i0})$$

$$= \sum_{i=1}^{64} (x_{i0}w_{i0} + 2x_{i0}w_{i1} + 2x_{i1}w_{i0} + \cdots + 64x_{i3}w_{i3})$$

$$= \sum_{i=1}^{64} x_{i0}w_{i0} + 2\sum_{i=1}^{64} x_{i0}w_{i1} + 2\sum_{i=1}^{64} x_{i1}w_{i0} + \cdots + 64\sum_{i=1}^{64} x_{i3}w_{i3}$$

210-16    210-15    210-14    210-1

500

<u>600</u>

900

1000

1

MIXED SIGNAL CIRCUITRY FOR BITWISE MULTIPLICATION WITH DIFFERENT ACCURACIES

BACKGROUND

The field relates to electronics and, more particularly, to mixed signal circuitry. Mixed signal circuitry operates in both an analog signal domain and a digital signal domain. Accordingly, analog-to-digital conversion (ADC) is typically needed to perform at least some computations. However, ADC conversion energy can be a limiting factor in mixed signal circuit designs.

SUMMARY

Embodiments of the invention provide improved techniques for performing different portions of bitwise multiplication with different accuracies in mixed signal circuitry.

In one embodiment, an apparatus comprises at least one processor and at least one memory including instruction code. The at least one memory and the instruction code are configured to, with the at least one processor, cause the apparatus at least to perform, with a first accuracy, a first portion of a bitwise multiplication of first and second digital inputs, and to perform, with a second accuracy different than the first accuracy, at least a second portion of the bitwise multiplication of the first and second digital inputs.

In another embodiment, a method of performing a multiply and accumulate operation comprises the steps of performing, with a first accuracy, a first portion of a bitwise multiplication of first and second digital inputs and performing, with a second accuracy different than the first accuracy, at least a second portion of the bitwise multiplication of the first and second digital inputs. The method is executed by processing circuitry configured to execute instruction code.

In another embodiment, an article of manufacture comprises a non-transitory computer-readable storage medium having embodied therein executable instruction code that when executed by a processor causes the processor to perform the steps of performing, with a first accuracy, a first portion of a bitwise multiplication of first and second digital inputs and performing, with a second accuracy different than the first accuracy, at least a second portion of the bitwise multiplication of the first and second digital inputs.

In another embodiment, a system comprises a multiply-accumulate unit configured to perform binary multiplication of first and second vectors. The multiply-accumulate unit comprises a set of two or more bitwise dot-product summation units each configured to perform bitwise multiplication of a portion of the first and second vectors to produce a digital output. Each bitwise dot-product summation unit of the set of two or more bitwise dot-product summation units comprises at least one instance of a bitwise dot-product computation unit coupled to an instance of a successive approximation register analog-to-digital converter unit, the successive approximation register analog-to-digital converter unit being configured to convert an analog output of the dot-product computation unit to at least a portion of the digital output. A first subset of the set of two or more bitwise dot-product summation units having a first accuracy are utilized for computing a first portion of the bitwise multiplication of the first and second vectors, and a second subset of the set of two or more bitwise dot-product summation units having a second accuracy different than the first accuracy are utilized for computing a second portion of the bitwise multiplication of the first and second vectors.

In another embodiment, a device comprises multiply-accumulate circuitry configured to perform binary multiplication of first and second vectors. The multiply-accumulate circuitry comprises a set of two or more instances of bitwise dot-product summation circuitry each configured to perform bitwise multiplication of a portion of the first and second vectors to produce a digital output. Each instance of the bitwise dot-product summation circuitry of the set of two or more instances of the bitwise dot-product summation circuitry comprises at least one instance of bitwise dot-product computation circuitry coupled to at least one instance of successive approximation register analog-to-digital converter circuitry, the successive approximation register analog-to-digital converter circuitry being configured to convert an analog output of the bitwise dot-product computation circuitry to at least a portion of the digital output. A first subset of the set of two or more instances of the bitwise dot-product summation circuitry having a first accuracy are utilized for computing a first portion of the bitwise multiplication of the first and second vectors, and a second subset of the set of two or more instances of the bitwise dot-product summation circuitry having a second accuracy different than the first accuracy are utilized for computing a second portion of the bitwise multiplication of the first and second vectors.

These and other features and advantages of embodiments described herein will become more apparent from the accompanying drawings and the following detailed description.

BRIEF DESCRIPTION OF THE DRAWINGS

FIG. 4 depicts an algebraic representation associated with of a dot product computation with which one or more illustrative embodiments can be implemented.

DETAILED DESCRIPTION

Figures 1A, 1B:
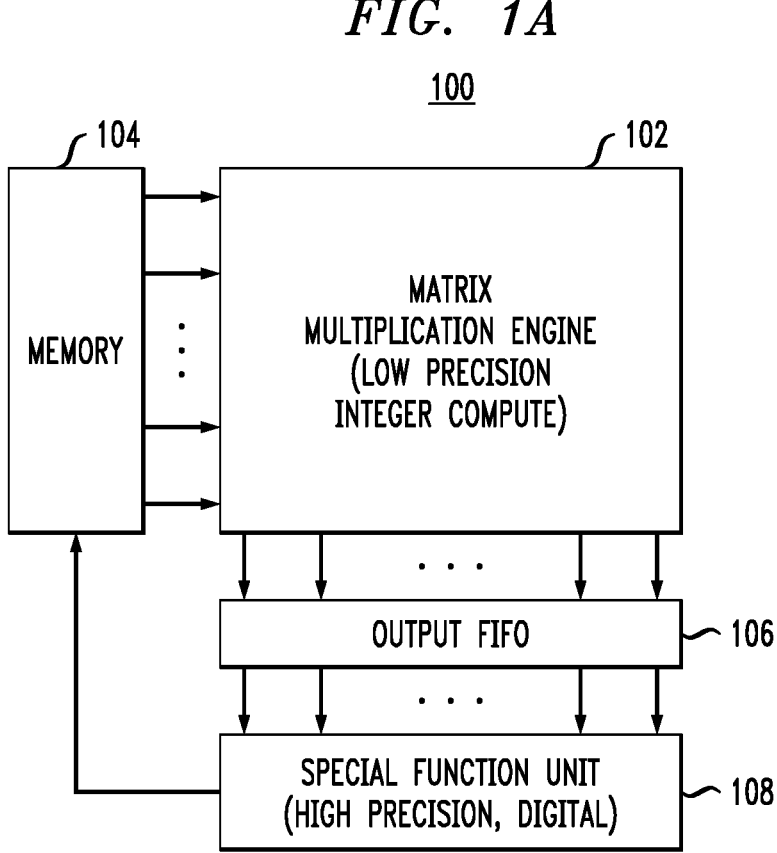
FIGS. 1A and 1B respectively depict a neural network accelerator and a mathematical representation of computations performed therein with which one or more illustrative embodiments can be implemented.

It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Further, it is to be understood that the phrase "configured to" as used in conjunction with a circuit (the term "circuitry" may be used interchangeably herein), structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise discrete circuit elements (e.g., transistors, inverters, logic gates, etc.), programmable elements, processing devices, one or more integrated circuits and/or other types of circuitry, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, integrated circuits and/or other types of circuitry that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

A neural network model is one of the most widely used types of machine learning (ML) algorithms in artificial intelligence systems. For example, a neural network model can be used to recognize underlying relationships and/or patterns in a set of data through a process that mimics the manner in which the human brain operates. The neural network model is first trained using a training data set (training stage), and then the trained neural network model is used to recognize relationships and/or patterns in a target data set (inference stage).

Many workloads that execute a neural network model require a large number of matrix multiplications which typically involve multiply-accumulate (MAC) operations. It is realized that accumulate operations are generally energy-inefficient when performed in the digital signal domain, but much more energy-efficient in the analog signal domain. As such, it has further been realized that by combining digital signal domain techniques for multiplication and analog signal domain techniques for accumulation, a more efficient multiply-accumulate operation can be achieved. Circuitry that combines analog and digital processing to perform MAC operations is referred to as mixed signal MAC (MS-MAC) circuitry.

FIG. 1A illustrates a neural network accelerator 100 with which one or more illustrative embodiments can be implemented. In some illustrative embodiments, neural network accelerator 100 is implemented in one or more graphics processing units (GPUs), one or more field programmable gate arrays (FPGA), one or more application-specific integrated circuits (ASICs), one or more multi-core central processing units (CPUs) and/or other types of circuitry. By way of example, neural network accelerator 100, or portions thereof, can comprise one or more of the above devices customized for a particular purpose that comprise circuitry (e.g., circuits, processors, memory, etc.) that are programmed with executable program code (e.g., instruction code, computer program code, etc.) or otherwise configured for the particular purpose. By way of example only, the particular purpose can be the implementation and execution of an artificial intelligence system (e.g., machine learning algorithm). Neural network accelerator 100 may also be part of a system-on-chip (SoC), e.g., such as a neuromorphic computing system. However, neural network accelerator 100 can be used in a variety of other applications that would benefit from such artificial intelligence-based decision making.

As shown, neural network accelerator 100 comprises a matrix multiplication engine 102 configured to perform computations corresponding to convolution layers and fully-connected layers of a neural network, which can typically be performed using low precision integer computations on data from memory 104. Results are then forwarded via an output first-in-first-out (FIFO) data structure 106 to a special function unit 108 that performs computations corresponding to one or more activation functions such as, but not limited to, batch normalization, a sigmoid function, a rectified linear unit (ReLU) function, and a SoftMax function. Computations in special function unit 108 typically need to be performed in high-precision to preserve the accuracy of the neural network that is mapped to the accelerator.

However, it is realized that matrix multiplication represents the bulk of the computation in neural network workloads, and thus matrix multiplication engine 102 can consume a significant percentage of the total power consumed by neural network accelerator 100. It is further realized that the low-precision integer computations being performed in matrix multiplication engine 102 can be performed by operating at least partially in the analog domain resulting in an accelerator with lower total power consumption compared to an accelerator that performs the entirety of its computations in the digital domain utilizing digital circuits.

FIG. 1B illustrates a mathematical representation 110, in accordance with an illustrative embodiment, to enable a vector dot product (also referred to as an inner product herein, as will be further explained) computed by one or more multiply-accumulate operations in neural network accelerator 100 of FIG. 1A. In the example of FIG. 1B, the left-side equation mathematically represents the dot product of two vectors x and w, each of size 64, where elements $x_i$ and $w_i$ each have 4 bits. Each four bit by four bit product (4b*4b) is split into 16 one bit by one bit products (1b*1b). The right-side equation mathematically represents the 1b*1b multiplication, where and $w_{ix}$ each have 1 bit.

The bitwise product is performed first, and then the summation is performed based on the weights of the bits. In essence, the 4-bit by 4-bit term is split into 16 one-bit products, and the one-bit products are accumulated (summed) and then appropriately scaled by a power of two by the outer summation to generate an aggregate sum. Based on power considerations, the 1b*1b multiplication is performed in the digital domain, the inner summation of the 1b*1b multiplication is performed in the analog domain, and the outer summation is performed in the digital domain. The inner summation is performed in the analog domain as this is where analog circuitry outperforms digital circuitry in terms of power. The 16-way addition may be performed in the digital domain as there is little advantage to doing this in the analog domain. In one example embodiment, the inputs and outputs of the inner summation are digital.

Note that FIG. 1B represents one illustrative embodiment and thus other embodiments can use different partitioning of analog and digital domain computations. Furthermore, it is also to be appreciated that the dot product computation depicted as mathematical representation 110 is intended as an example to facilitate explanation. Thus, implementations wherein dot products of vectors x and w where elements $x_i$ and $w_i$ have a different number of bits, as well as where one vector has a different number of elements as compared to the other vector, are supported by alternative embodiments based on the teachings provided herein.

Figure 2:
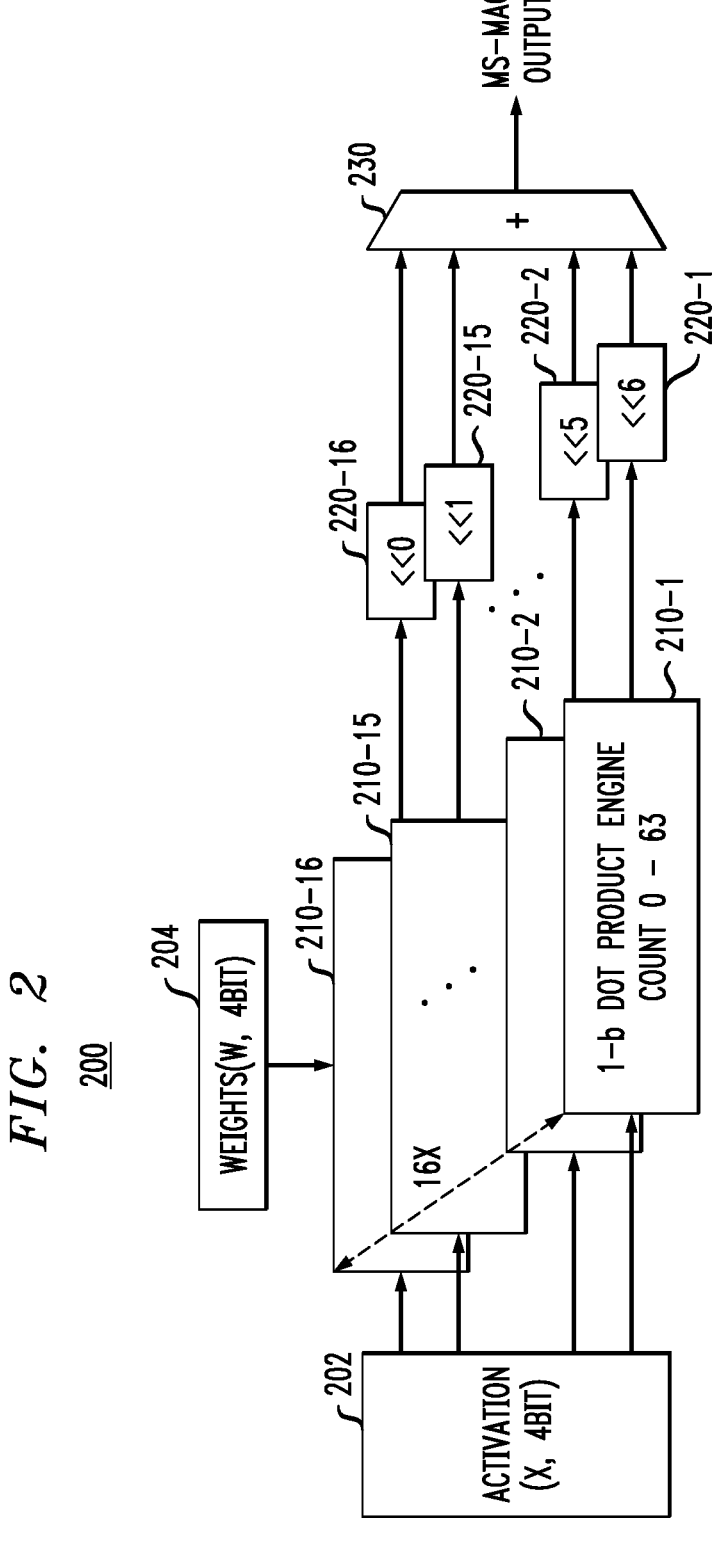
FIG. 2 depicts mixed signal multiply-accumulate circuitry with which one or more illustrative embodiments can be implemented.

FIG. 2 illustrates a mixed signal multiply-accumulate circuit 200 for performing integer matrix multiplication, in accordance with an illustrative embodiment. It is to be appreciated that part or all of mixed signal multiply-accumulate circuit 200 can be implemented, in some embodiments, as part of matrix multiplication engine 102 of FIG. 1. As shown, each bit $x_i$ of a first digital input X, and the corresponding bit representing the digital weight $w_i$ of a second digital input W, are input into one of 16 1-bit (1-b) dot product engines 210-1, 210-2 . . . , 210-15, 210-16 (collectively referred to as dot product engines 210 herein). The dot product engines 210 can be referred to as counters since they, effectively, count the number of is that occur in the binary multiplication operations, as will be further explained below. In one example, the first digital input X represents an activation function represented by elements of 4 bits, while the second digital input W represents weights represented by elements of 4 bits. Digital partial sums 220-1, 220-2 . . . , 220-15, 220-16 (collectively referred to as partial sums 220 herein) are respectively output by dot product engines 210-1, 210-2 . . . , 210-15, 210-16. Digital partial sums 220 are input into a digital reduction circuit 230 which performs an outer summation to generate the MS-MAC output.

Figure 3A:
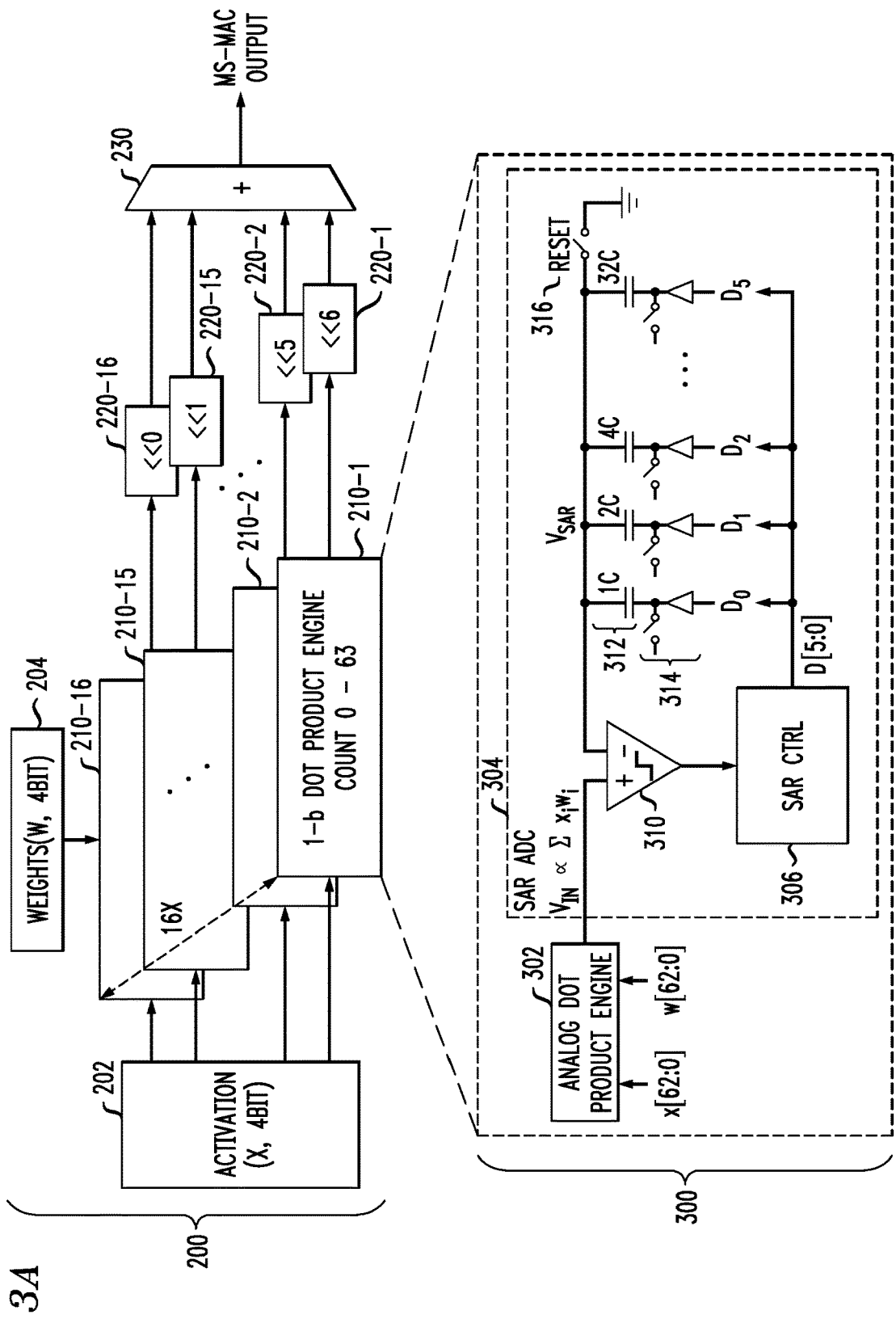
FIGS. 3A and 3B depict dot product engines with which one or more illustrative embodiments can be implemented.
Figure 3B:
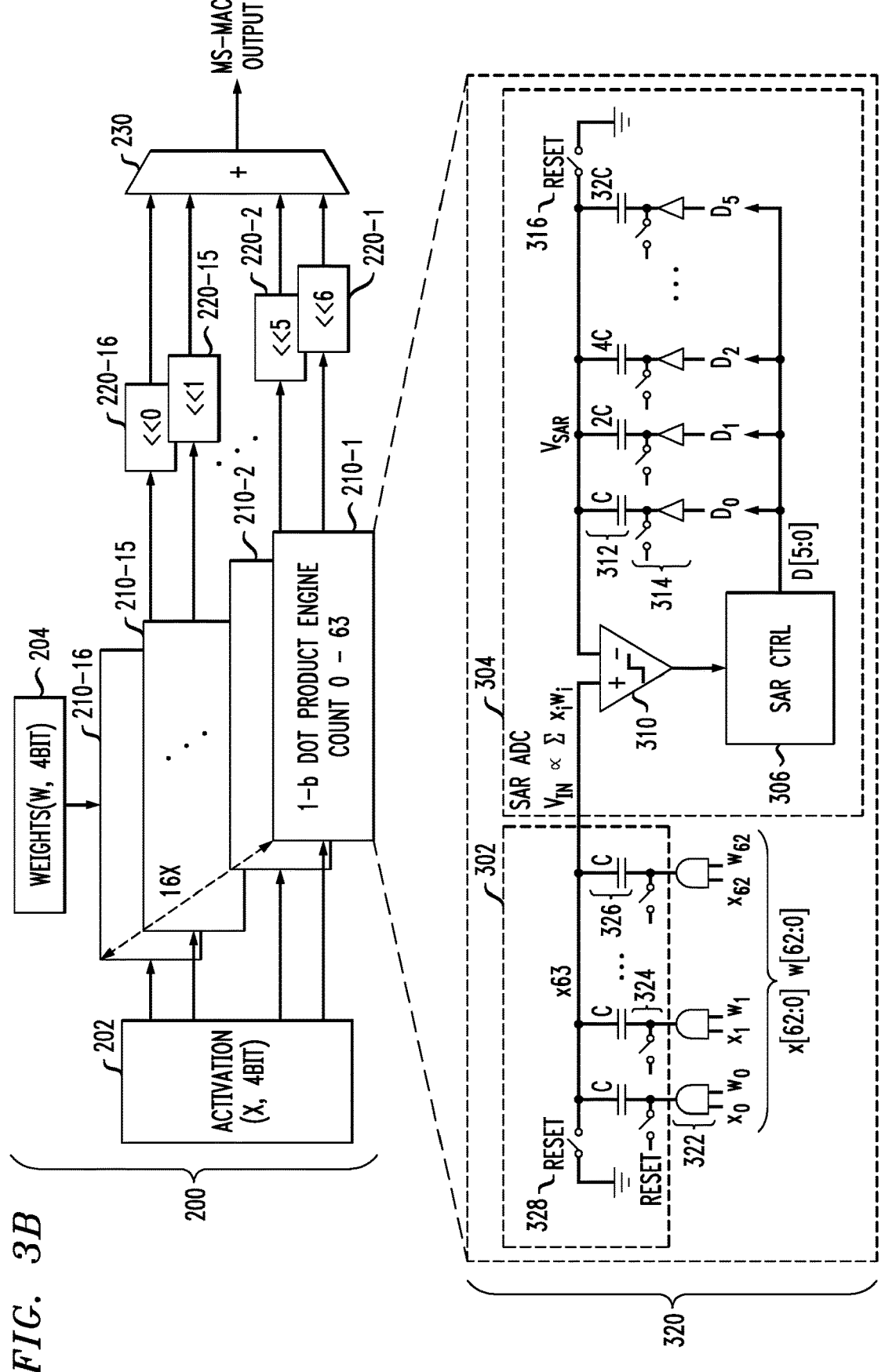

FIGS. 3A and 3B illustrate examples of MS-MAC circuitry configured for inner product summation performed by dot product engines 210 in accordance with illustrative embodiments. In the illustrative embodiments of FIGS. 3A and 3B, it is assumed that the input vectors X and W each comprise 63 elements, and each element comprises 4 bits. In general, MS-MAC circuitry performs multiplication in the digital signal domain using digital logic and accumulation in the analog domain using charge-sharing capacitors. Effectively, MS-MAC circuitry multiplies digital inputs in the digital domain, accumulates multiplication results in the analog domain, and generates a binary-weighted digital code based on the accumulated results. The number of bits of the binary-weighted digital code are referred to as the analog resolution or quantization level (p) of the analog-to-digital conversion operation performed by MS-MAC circuitry. In order to generate a unique binary-weighted code for a set of 63-bit inputs, p is 6, i.e., D[0:5]. Throughout FIGS. 3A and 3B, circuit elements which provide like or similar functionality utilize the same or similar reference numerals.

More particularly, as shown in FIG. 3A, MS-MAC circuitry 300 includes an analog dot product engine 302 and a successive approximate register (SAR) ADC 304. As shown, the analog dot product engine 302 provides an output $V_{IN}$ to a comparator 310 of the SAR ADC 304, where the input $V_{IN}$ is proportional to the sum of the weights $\Sigma x_i w_i$ produced by the analog dot product engine 302. The analog dot product engine 302 receives inputs x[62:0] and w[62:0], and produces the output $V_{IN} \propto \Sigma x_i w_i$. The output of the comparator 310 is input to a SAR controller 306. The SAR controller 306 outputs the binary-weighted code D[0:5], which is provided to a set of capacitors 312 (with respective capacitance values C, 2C, 4C, 8C, 16C, 32C). It is to be appreciated that the bits of the binary-weighted code D[0:5] are respectively coupled to the set of capacitors 312 (e.g., from the most significant bit (MSB) through to the least significant bit (LSB)). For 6-bit quantization, the MSB (D5) of the binary-weighted output of SAR controller 306 is coupled to the 32C capacitor, the next bit (D4) is coupled to a 16C capacitor, the next bit (D3) is coupled to an 8C capacitor, the next bit (D2) is coupled to an 4C capacitor, the next bit (D1) is coupled to the 2C capacitor, and the LSB (D0) is coupled to the 1C capacitor. The binary-weighted code D[0:5] output from the SAR controller 306 is provided to the bottom plates of the capacitors 312 through a set of buffers and switches 314 as illustrated. The SAR ADC 304 also includes a reset switch 316, which when opened allows the top plates of the capacitors 312 to electrically float.

FIG. 3B shows MS-MAC circuitry 320 illustrating an example implementation of the analog dot product engine 302. As shown in FIG. 3B, the analog dot product engine 302 includes a set of 63 AND gates 322, each of which performs multiplication of a corresponding set of the inputs x[62:0] and w [62:0]. The outputs of the AND gates 322 (i.e., $x_0*w_0$, $x_1*w_1$, . . . , $x_{62}*w_{62}$) are coupled via reset switches 324 to bottom plates of capacitors 326, each of which has a same capacitance value C. The analog dot product engine 302 further includes a reset switch 328. The top plates of the capacitors 326 provide the output $V_{IN} \propto x_i w_i$ to the comparator 310.

In illustrative embodiments, a dot product $$\left[ \sum_{i=1}^{64} X_i W_i \right]$$

is computed in a mixed-signal domain, where $X_i$ and $W_i$ may be low-precision (e.g., four-bit integers, INT4). As described elsewhere herein, computing the dot-product is advantageous from a power perspective over fully-digital implementations. Mixed signal computation, however, is susceptible to noise and bit errors. Illustrative embodiments described herein provide techniques for making such mixed-signal domain computations more robust to noise.

FIG. 4 depicts an algebraic representation 400 associated with the dot product computation performed by the dot product engines 210. The dot product engines 210, which are illustratively implemented as pop-counters in the analog domain, count the number of 1's (non-zeros) amongst 64-bitwise multiplications. For 64-bitwise multiplications, this may be represented as:

$$\sum_{1}^{64} x_i * w_i \Rightarrow \sum_{\substack{m,n \\ 16}} 2^j \sum_{i=0}^{63} x_{i,m} * w_{i,n}$$

where binary numbers (products) are decomposed into multiple bit positions. After decomposition, 16 terms are generated, each of which will be computed by an analog pop counter (e.g., one of the dot product engines 210). The final output is computed in the digital back-end (e.g., with shifters and adders). The computation of:

$$\sum_{i=0}^{63} x_{i,m} * w_{i,n}$$

is illustratively performed in the analog domain, with the computation of:

$$\sum_{\substack{m,n \\ 16}} 2^j$$

being performed in the digital domain. As shown in FIG. 4, each of the "boxes" may be replaced by an analog pop-counter (e.g., one of the dot product engines 210). Thus, the term $$\sum_{i=1}^{63} x_{i0} w_{i0}$$

may be implemented via dot product engine 210-1, the term $$\sum_{i=1}^{63} x_{i0} w_{i1}$$

may be implemented via dot product engine 210-2, the term $$\sum_{i=1}^{63} x_{i1} w_{i0}$$

may be implemented via dot product engine 210-3, . . . and the term $$\sum_{i=1}^{63} x_{i3} w_{i3}$$

may be implemented using the dot product engine 210-16.

More particularly, consider that there are 64 X's in input 202 and 64 W's in input 204, and that each X and W has 4-bit precision such that 64 multiplications (e.g., products) are being performed, and all those products are added up. Further consider one multiplication out of the 64, called X times W (where capital X and W means that each of these are represented in 4-bit binary numbers). X may be rewritten as 8a+4b+2c+1d and W may be rewritten as 8p+4q+2r+1s. X times W thus becomes:

$$X * W = (8a + 4b + 2c + 1d)(8p + 4q + 2r + 1s)$$

$$X * W = 64ap + 32bp + 16cp + 8dp + 32aq + 16bq +$$

$$8c + 4dq + 16ar + 8br + 4cr + 2dr + 8as + 4bs + 2cs + 1ds$$

-continued $$X * W = 64ap + 32(bp + aq) + 16(cp + bq + ar) +$$

$$8(dp + cq + br + as) + 4(dq + cr + bs) + 2(dr + cs) + 1ds$$

Thus, it can be seen that different terms will be multiplied by factors 64, 32, 16, . . . , 1, and there is some overlap. For example, three terms cp, bq and ar are multiplied by the same factor of 16. For binary numbers, multiplication by 16 (=$2^4$) may be achieved through a simple shift by 4 bits. Thus, multiplication by the factors 64, 32, 16, 8, 4, 2 and 1 may be represented as <<6, <<5, <<4, <<3, <<2, <<1 and <<0 (where "<<" means shift by left). This is denoted in the digital partial sums 220 described above with respect to FIGS. 2, 3A and 3B (e.g., digital partial sum 220-1 is <<6, digital partial sums 220-2 and 220-3 are <<5, digital partial sums 220-4 through 220-6 are <<4, digital partial sums 220-7 through 220-10 are <<3, digital partial sums 220-11 through 220-13 are <<2, digital partial sums 220-14 and 220-15 are <<1, and digital partial sum 220-16 is <<0).

Each of the analog pop-counters (e.g., dot product engines 210) generates an equal probability of bit error rate (BER), regardless of bit position. If bit error happens in the pop-counter with the highest weighted sum-of-products (e.g., the term $$\sum_{i=1}^{63} x_{i3} w_{i3}$$

having an impact factor of 64), that impact will be 64 times bigger than a bit error that happens in the pop-counter with lowest weighted sum-of-products (e.g., the term $$\sum_{i=1}^{63} x_{i0} w_{i0}$$

having an impact factor of 1). In the structure shown in FIG. 2, for example, the highest weighted sum-of-products is associated with the 1-b dot product engine 210-1 and digital partial sum 220-1, and the lowest weighted sum-of-products is associated with the 1-b dot product engine 210-16 and digital partial sum 220-16.

Figure 5:
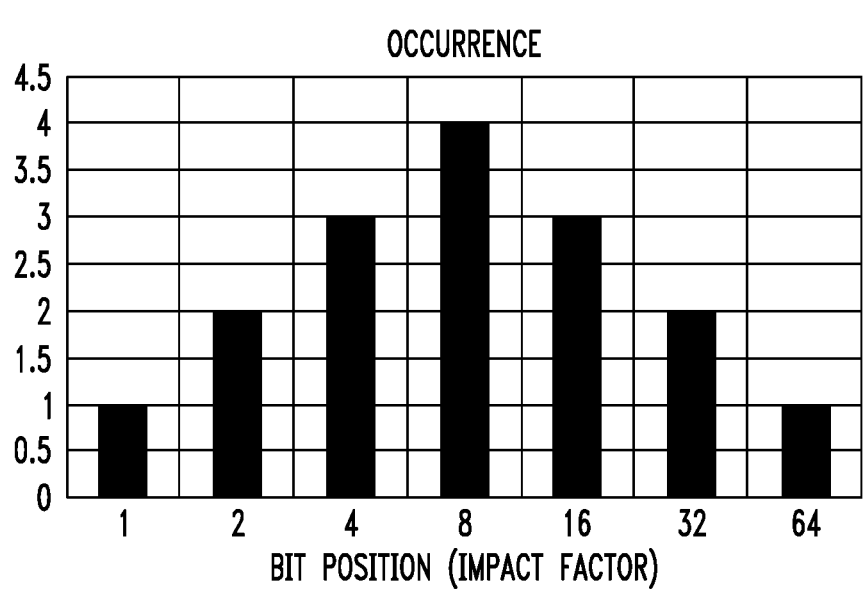
FIG. 5 depicts a plot of bit position impact factors for additive noise contribution of different terms of a dot product computation according to an illustrative embodiment.

FIG. 5 shows a table 500, illustrating the impact factors of each of the terms (e.g., of the algebraic representation 400 of FIG. 4), along with their respective counts of occurrence. Due to the properties of a successive approximation register (SAR) analog-to-digital converter (ADC) which may be used to implement the dot product engines 210, as discussed above, there might by only +/−1 error from each of the analog pop-counters.

Let $X_i$ be an additive noise on the i-th term, such that the total noise is determined according to:

$$\eta = X_1 + 2X_2 + 2X_3 + 4X_4 + 4X_5 + 4X_6 + 8X_7 + 8X_8 +$$

$$8X_9 + 8X_{10} + 16X_{11} + 16X_{12} + 16X_{13} + 32X_{14} + 32X_{15} + 64X_{16}$$

9 where:

$$X_i = \begin{cases} -1 \text{ with } p = \dfrac{BER}{2}, & @\,popCNT_i > 0 \\ 0, \text{ with } p = 1 - BER \\ 1 \text{ with } p = \dfrac{BER}{2}, & @\,popCNT_i < 63 \end{cases}$$

and where the error, E, is determined according to:

$$E[X] = 0, \text{ Var}[X_i] = E\left[X^2\right] - (E[X])^2 = BER$$

where Var[$X_i$] denotes the variance of $X_i$, and BER denotes the bit error rate. $E[\eta]=0$, and:

$$\text{Var}[\eta] = \left( \begin{matrix} 1 + 2^2 + 2^2 + 4^2 + 4^2 + 4^2 + 8^2 + 8^2 + 8^2 \\ + 8^2 + 16^2 + 16^2 + 16^2 + 32^2 + 32^2 + 64^2 \end{matrix} \right) \text{Var}[X_i]$$
$$= 7225 * \text{Var}[X_i] = 7225 * BER$$

If the higher-weighted terms (e.g., $X_{16}$, $X_{15}$, $X_{14}$, etc.) are reduced, this has an outsized impact on the total noise. Consider, for example, if $X_{16}$, $X_{15}$, and $X_{14}$ are each reduced by 100×. In this case, then:

$$\text{Var}[\eta] = \left( \begin{matrix} 1 + 2^2 + 2^2 + 4^2 + 4^2 + 4^2 + 8^2 \\ + 8^2 + 8^2 + 8^2 + 16^2 + 16^2 + 16^2 \end{matrix} \right) \text{Var}[X_i] =$$
$$1081 * \text{Var}[X_i] = 1081 * BER$$

where the last three additive noise terms are assumed to contribute negligibly as they are reduced by 100×.

Accordingly, to make a MAC engine more robust to noise, some embodiments use different architectures for different ones of the dot product engines 210 (e.g., different ones of the 1-b multiplying pop-counters). Such different architectures provide different accuracy relative to one another. By using a first architecture with higher accuracy (and thus less noise) for some of the dot product engines 210 (e.g., those corresponding to higher-weighted terms), and using a second architecture with relatively lower accuracy for other ones of the dot product engines 210 (e.g., those corresponding to relatively lower-weighted terms), the overall computation accuracy may be increased.

In the description below, it is assumed that only two different types of architectures are used: a first type of architecture for the pop-counters associated with the three highest-weighted terms (e.g., dot product engines 210-1, 210-2 and 210-3 in the example above, which correspond to the higher-weighted terms $X_{16}$, $X_{15}$, and $X_{14}$); and a second type of architecture for the rest of the pop-counters (e.g., dot product engines 210-4 through 210-16, which correspond to the relatively lower-weighted terms $X_{13}$ through $X_1$), where the first architecture provides a higher accuracy than the second architecture. It should be appreciated, however, that it is possible to use more than two different types of architectures (e.g., having different associated accuracies relative to one another) for different subsets of the pop-counters in other implementations. For example, in some embodiments three different types of architectures are used: a first type of architecture for the pop-counters associated with the three highest-weighted terms (e.g., dot product engines 210-1, 210-2 and 210-3 in the example above, which correspond to the higher-weighted terms $X_{16}$, $X_{15}$, and $X_{14}$); a second type of architecture for the pop-counters associated with the next three highest-weighted terms (e.g., dot product engines 210-4, 210-5 and 210-6 in the example above, which correspond to the medium-weighted terms $X_{13}$, $X_{12}$, and $X_{11}$); and a third type of architecture for the remaining pop-counters (e.g., dot product engines 210-7 through 210-16, which correspond to the relatively lower-weighted terms $X_{10}$ through $X_1$), where the first architecture provides a higher accuracy than the second architecture, and wherein the second architecture provides a higher accuracy than the third architecture. Various other examples are possible, using different numbers of types of architectures providing different accuracies, and with different ones of the pop-counters using different ones of the architectures.

The different types of architectures may provide different accuracies (e.g., noise improvements or BER) in a variety of ways, including but not limited to improving accuracy: through the use of lower resolution pop-counters which effective increases the minimum voltage step and thus improves the signal to noise ratio (SNR); through the use of bigger capacitors with lower thermal noise (kT/C) and lower capacitor mismatch; through the use of lower noise comparators (e.g., here the noise of a comparator may be dominated by the thermal noise of transistors in the comparator); through the use of more accurate offset cancellation on the comparators; combinations thereof; etc.

Figure 6:
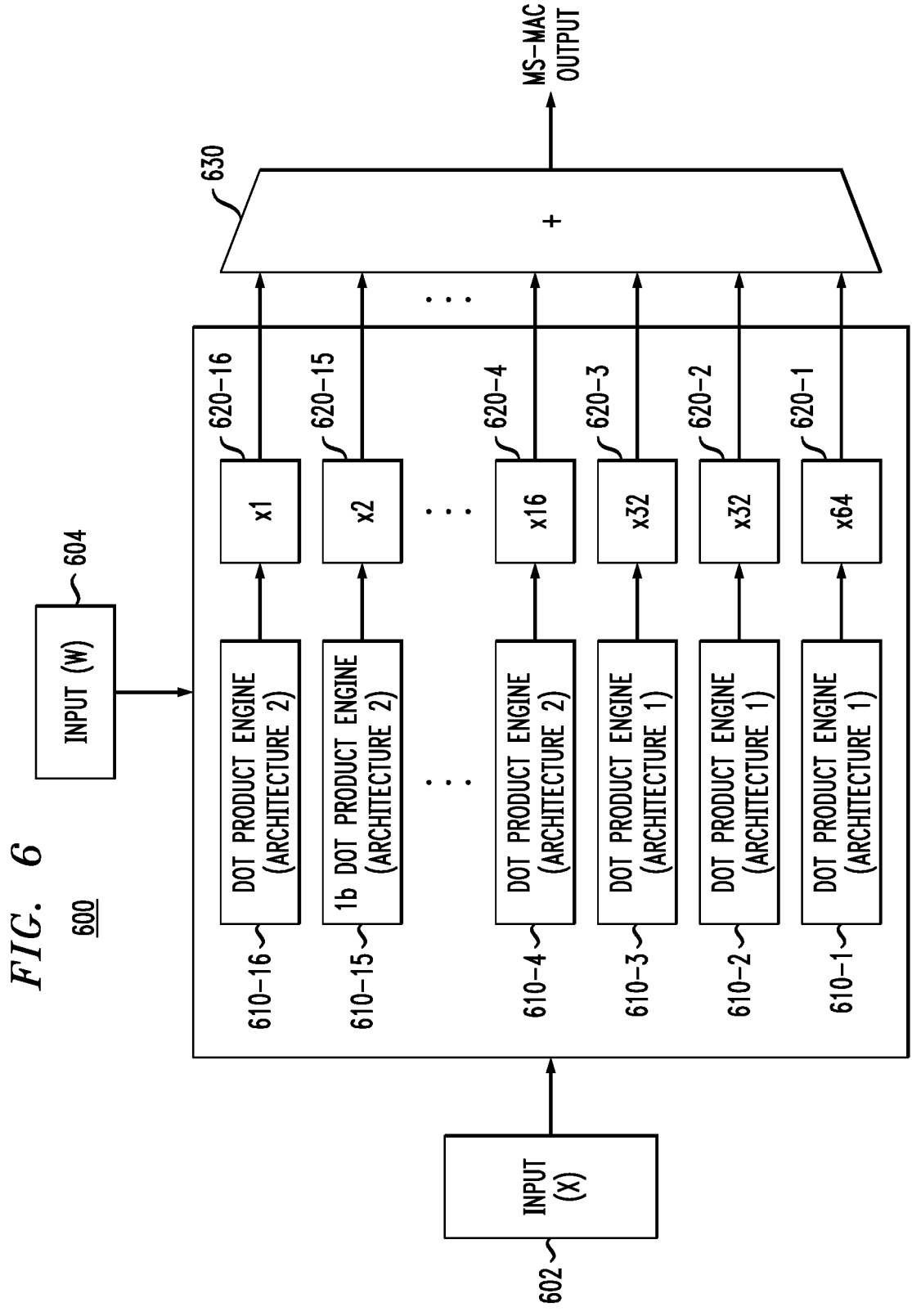
FIG. 6 depicts mixed signal multiply-accumulate circuitry which utilizes different hardware architectures for different dot product engines according to an illustrative embodiment.

FIG. 6 illustrates a mixed signal multiply-accumulate circuit 600, which is similar to the mixed signal multiply-accumulate circuit 200, and is utilizable for performing integer matrix multiplication, in accordance with an illustrative embodiment. It is to be appreciated that part or all of mixed signal multiply-accumulate circuit 600 can be implemented, in some embodiments, as part of matrix multiplication engine 102 of FIG. 1. As shown, each bit $x_i$ of a first digital input X, and the corresponding bit representing the digital weight $w_i$ of a second digital input W, are input into one of 16 1-bit (1-b) dot product engines 610-1, 610-2 . . . , 610-15, 610-16 (collectively referred to as dot product engines 610 herein). The dot product engines 610, similar to the dot product engines 210, can be referred to as counters since they, effectively, count the number of is that occur in the binary multiplication operations. In one example, the first digital input X represents an activation function represented by elements of 4 bits, while the second digital input W represents weights represented by elements of 4 bits. Digital partial sums 620-1, 620-2 . . . , 620-15, 620-16 (collectively referred to as partial sums 620 herein) are respectively output by dot product engines 610-1, 610-2 . . . , 610-15, 610-16. Digital partial sums 620 are input into a digital reduction circuit 630 which performs an outer summation to generate the MS-MAC output.

Whereas each of the dot product engines 210 in the mixed signal multiply-accumulate circuit 200 of FIG. 2 were assumed to utilize a same architecture, different ones of the dot product engines 610 in the mixed signal multiply-accumulate circuit 600 of FIG. 6 utilize different architectures. More specifically, continuing with the example above, the three dot product engines 610-1, 610-2 and 610-3 (associated with term weights ×64, ×32 and ×32, respectively) utilize a first architecture while the remaining dot product engines 610-4 through 610-16 (associated with term weights ×16 through ×1) utilize a second architecture, where the first architecture provides a higher accuracy than the second architecture. Such different accuracy may be implemented using a variety of techniques as described above.

Figure 7:
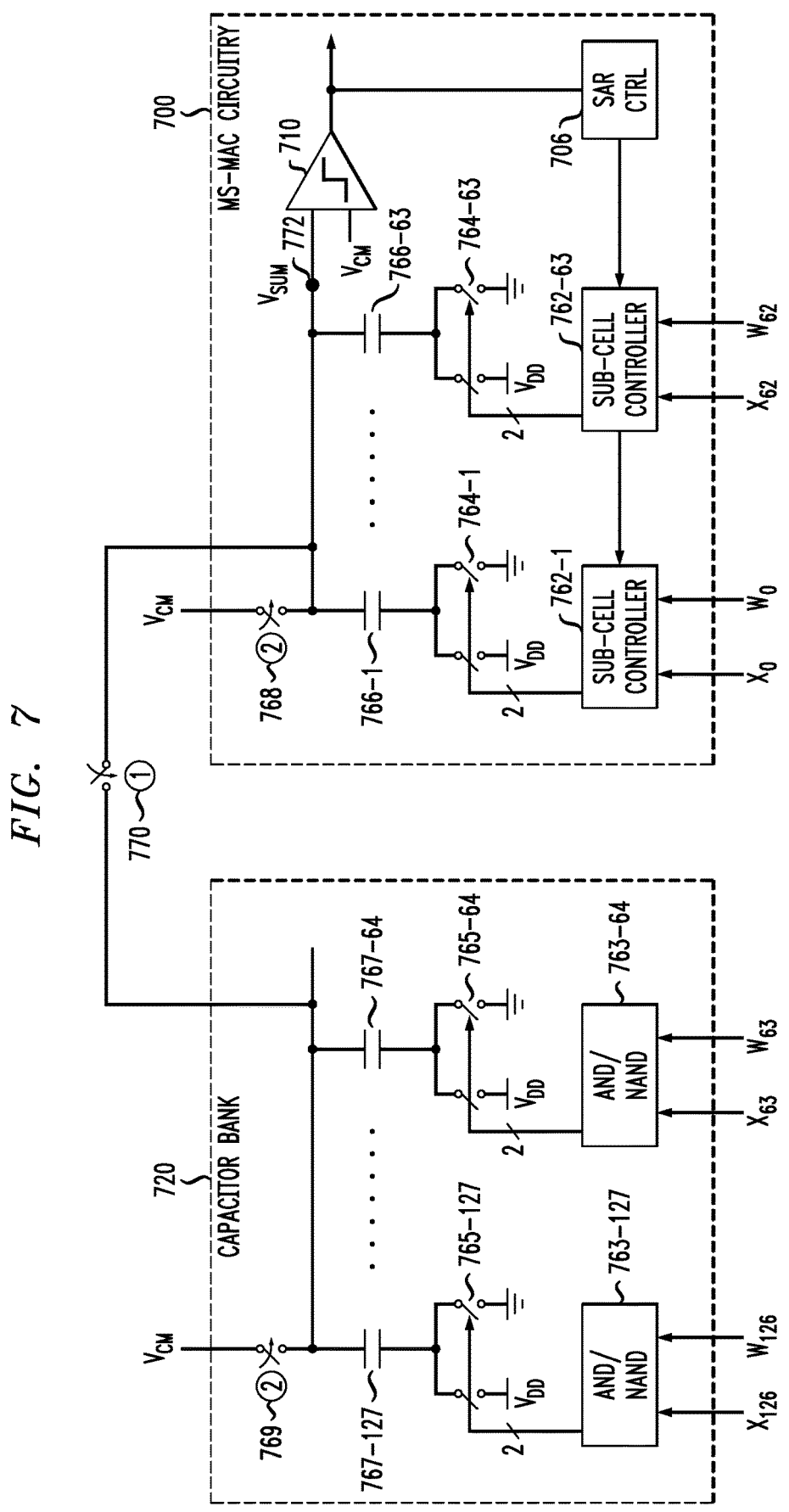
FIG. 7 depicts an architecture of a dot product engine according to an illustrative embodiment.

In some embodiments, different accuracy for different architectures may be achieved through introducing quantization noise in the architectures with lower accuracy. FIG. 7 shows an example implementation of MS-MAC circuitry 700 (e.g., a pop-counter) which is connected to an additional capacitor bank 720. The MS-MAC circuitry 700 and 720 may be collectively referred to as implementing a "split" pop-counter. The dot product engine 700 includes a SAR controller 706 and comparator 710. The SAR controller 706 controls a set of sub-cell controllers 762-1 through 762-63 (collectively, sub-cell controllers 762) which receive respective sets of inputs $x_0$, $w_0$ through $x_{62}$, $w_{62}$. The sub-cell controllers 762 may implement digital (logical) AND gates with outputs coupled to sets of switch pairs 764-1 through 764-62 (collectively, switch pairs 764). The switch pairs 764 enable the MS-MAC circuitry 700 to switch between a summation operating phase and an SAR operating phase, as will be further explained, via control inputs generated by SAR controller 706.

The switch pairs 764 are connected to respective bottom plates of a set of capacitors 376-1, . . . , 766-63 collectively referred to as capacitors 766. Capacitors 766 each have the same capacitance $C_0 = \ldots = C_{63}$. Top plates of capacitors 766 are connected to a first input of comparator 710 as well as to a precharge switch 768. Precharge switch 768 selectively applies a common mode voltage $V_{CM}$ to the top plates of capacitors 766 via a control signal as will be further explained. A second input of comparator 710 is connected to $V_{CM}$. The voltage $V_{CM}$ is set to the natural common-mode voltage of comparator 710, the voltage at which comparator 710 is most likely to have the best sensitivity/noise characteristics. The output of comparator 710 is connected to the SAR controller 706. SAR controller 706 outputs a binary-weighted code D[0:5]. Although not explicitly shown in FIG. 7, data inputs and control inputs may be buffered through different buffers. A clock signal (clk, not expressly shown) may be used to synchronize the timing between SAR controller 706 and comparator 710, which may be buffered by a clock buffer (not expressly shown).

The MS-MAC circuitry 700 is coupled to an additional capacitor bank 720 as illustrated, which includes a set of digital (logical) AND or NAND gates 763-64, . . . 763-127 (collectively, AND/NAND gates 763 which receive respective sets of inputs $x_{63}$, $w_{63}$ through $x_{126}$, $w_{126}$. The AND/NAND gates 763 have outputs coupled to sets of switch pairs 765-64 through 765-127 (collectively, switch pairs 765). The switch pairs 765 are coupled to bottom plates of capacitors 767-64, . . . 767-127 (collectively, capacitors 767). The top plates of the capacitors 767 are coupled via switch 770 such that they contribute to the voltage at common node 772 when the switch 770 is closed. Precharge switch 769 selectively applies a common mode voltage $V_{CM}$ to the top plates of capacitors 767 via a control signal as will be further explained.

In the MS-MAC circuitry 700, during summation both the capacitors 766 and 767 are utilized, while during SAR conversion only the capacitors 766 are utilized. During the input summation phase, capacitors 766 and 767 are controlled individually, while during the SAR conversion operations, capacitors 766 are controlled in a binary weighted manner.

During a first operating phase (sum), precharge switches 768 and 769 are closed, such that $V_{SUM}$, the voltage at common node 372, is equal to $V_{CM}$, and the inputs of comparator 710 are effectively electrically shorted. Simultaneously, the product of each pair of inputs $x_i$, $w_i$ is computed by the sub-cell controllers 762 and AND/NAND gates 763, with the switches 764 and 765 controller whether the bottom plate of each of the capacitors 766 and 767 is charged to either a reference voltage (Vdd) or ground (0V) depending on the logical output of the sub-cell controllers 762 and AND/NAND gates 763. Thus, each capacitor 366 stores the charge $Q_i = C(x_i * w_i * V_{DD} - V_{CM})$.

During a second operating phase (SAR), the switch 770 is first opened, and then the precharge switches 768 and 769 are opened. In this way, the additional capacitor bank 720 is not utilized during the SAR operating phase. The precharge switch 768 is opened and the common node 772 connecting the top plates of capacitors 766 is allowed to electrically float. Next, switch pairs 764 are configured to pass a control output of SAR controller 706 via the sub-cell controllers 762 such that the output of SAR controller 706 controls an operating configuration of capacitors 766. That is, the set of capacitors 766 is configured as an array of binary-weighted capacitances in this phase, i.e., subsets of capacitors 766 are connected to predetermined ones of the bit control lines, e.g., LSB through MSB, of SAR controller 706. The bit control lines respectively correspond to the bits in the binary-weighted output (code) generated by SAR controller 706, e.g., D[0:5] for a quantization level of 6. That is, given ones of capacitors 766 are connected to a given one of the bit control lines, when the SAR control signal closes the corresponding switches of switch pairs 764. For 6-bit quantization, the MSB (D5) of the binary-weighted output of SAR controller 706 is coupled to capacitors 766-32 through 766-63 (32 capacitors), the next bit (D4) is coupled to capacitors 766-16 through 766-31 (16 capacitors), the next bit (D3) is coupled to capacitors 766-8 through 766-15 (8 capacitors), the next bit (D2) is coupled to capacitors 766-4 through 766-7 (4 capacitors), the next bit (D1) is coupled to capacitors 766-2 and 766-3 (2 capacitors), and the LSB (DO) is coupled to capacitor 766-1 (1 capacitor).

Depending on the result of the multiplication by the sub-cell controllers 762 and the resulting charge stored by the set of capacitors 766, a decision is made by comparator 710 (1 or 0) in successive iterations for each of the output bits D[0:5]. It therefore takes six SAR iterations to generate a 6-bit binary-weighted output for the 127-way data input shown in FIG. 3D.

To summarize the dot product computation performed by MS-MAC circuitry 700 of FIG. 7, in the first operating phase ($1^{st}$ cycle), sub-cell controllers 762 and AND/NAND gates 763 multiply the data received at their respective inputs and their outputs drive capacitors 766 and 767. Then, in the second operating phase ($2^{nd}$ through $7^{th}$ cycle, i.e., corresponding to a 6-bit binary-weighted output), regular SAR ADC operation is performed as explained above.

The MS-MAC circuitry 700 of FIG. 7 advantageously saves area and power associated with the comparator 710 and SAR controller 706, as well as avoiding large voltage swings on the capacitors 767 during the SAR ADC phase.

Figure 8:
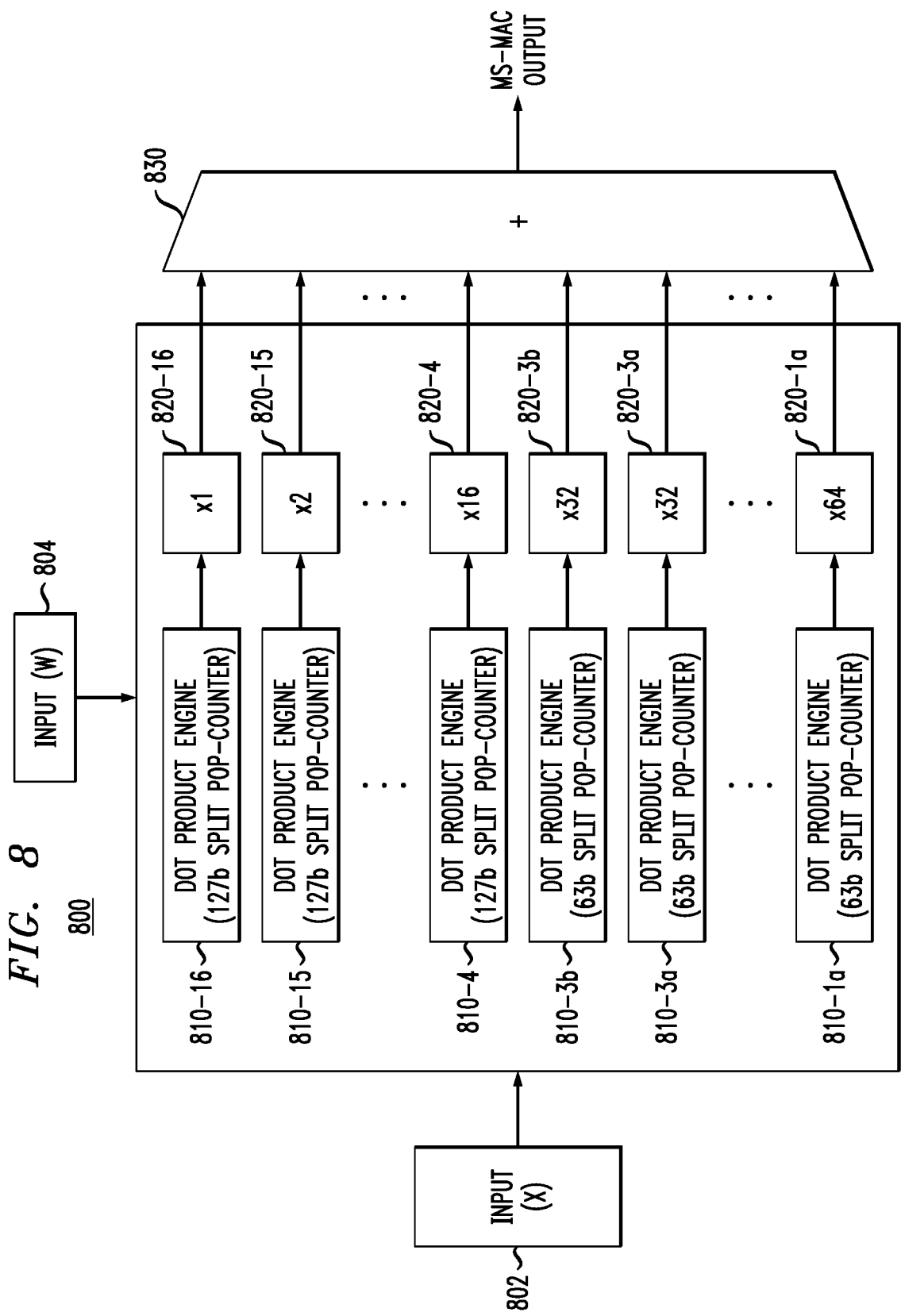
FIG. 8 depicts mixed signal multiply-accumulate circuitry which utilizes different hardware architectures for different dot product engines according to an illustrative embodiment.

FIG. 8 illustrates a mixed signal multiply-accumulate circuit 800, which is similar to the mixed signal multiply-accumulate circuit 600, and is utilizable for performing integer matrix multiplication, in accordance with an illustrative embodiment. It is to be appreciated that part or all of mixed signal multiply-accumulate circuit 800 can be implemented, in some embodiments, as part of matrix multiplication engine 102 of FIG. 1. As shown, each bit $x_i$ of a first digital input X, and the corresponding bit representing the digital weight $w_i$ of a second digital input W, are input into one of a set of dot product engines 810-1a, 810-1b, 810-2a, 810-2b, 810-3a, 810-3b, 810-4, 810-5, . . . 810-16 (collectively referred to as dot product engines 810 herein). The dot product engines 810-1a, 810-1b, 810-2a, 810-2b, 810-3a and 810-3b provide a higher accuracy architecture for the three highest weighted terms, with the dot product engines 810-4, 810-5, . . . 810-16 providing a relative lower accuracy architecture for the remaining relatively lower weighted terms. The relatively lower accuracy architecture used for the dot product engines 810-4, 810-5, . . . 810-16 may be the "split" pop-counter architecture shown and described above with respect to FIG. 7, while the higher accuracy architecture used for dot product engines 810-1a, 810-1b, 810-2a, 810-2b, 810-3a and 810-3b. The dot product engines 810-1a and 810-1b (collectively, dot product engine 810-1) are used for the highest weighted term, the dot product engines 810-2a and 810-2b (collectively, dot product engine 810-2) are used for the second highest weighted term, and the dot product engines 810-3a and 810-3b (collectively, dot product engine 810-3) are used for the third highest weighted term.

The mixed signal multiply-accumulate circuit 800 is configured to perform 128-way summation of 4-bit digital inputs 802 (X) and 804 (W). For the terms scaled by $\{1, 2, 4, 8, 16\}$ (e.g., the 13 relatively lowest weighted sums-of-products), the "split" pop-counter architecture of FIG. 7 may be used in the dot product engines 810-4 through 810-16. The "split" pop-counter architecture used in the dot product engines 810-4 though 810-16 is able to count the number of 1's only to the nearest even number, and thus the outputs (e.g., digital partial sums 820-4 through 820-16) are inexact (e.g., noisy). The split pop-counter architecture used in the dot product engines 810-4 through 810-16, however, are lower power than the "regular" or non-split pop-counters used in the dot product engines 810-1 through 810-3 used for the terms that are scaled by $\{32, 64\}$ (e.g., the three highest weighted sums-of-products). For each of these terms, the computation is split between two pop-counters that produce two results (e.g., 820-1a and 820-1b for the highest weighted sum-of-products, 820-2a and 820-2b for the second highest weighted sum-of-products, and 820-3a and 820-3b for the third highest weighted sum-of-products) that are summed up in the adder 830. For example, 820-1a is a sum of the first 63 terms and 820-1b is a sum of the last 63 terms for the highest weighted sum-of-products.

Overall, the mixed signal multiply-accumulate circuit 800 has 19 pop-counters: 6 63b pop-counters used for the dot product engines 810-1 through 810-3 associated with the three highest weighted sums-of-products, and 13 127b split pop-counters used for the dot product engines 810-4 through 810-16 associated with the remaining relatively lower weighted sums-of-products. The dot product engines 810-1 through 810-3 have a 6-bit design based on 63b pop-counters, with a target BER of $10^{-12}$. The dot product engines 810-4 through 810-16 sum 127 terms on a 6-bit design, which uses a 63b pop-counter circuit but which connects an additional capacitor bank as described above with respect to FIG. 7. Energy savings from the comparator, digital backend and SAR controller are expected, though quantization noise is introduced on the lower order pop-counters. In the FIG. 8 example, dot product engines 810-1 through 810-3 use a higher accuracy architecture and the dot product engines 810-4 through 810-16 use a relatively lower accuracy architecture. Power and area are saved on the less critical computations (e.g., for the thirteen relatively lower weighted sums-of-products), while the more critical computations (e.g., the three highest weighted sums-of-products) are performed with higher accuracy.

It should be appreciated again that the particular numbers and arrangement of the dot product engine architectures shown in FIG. 8 are presented by way of example only. For example, in other embodiments the higher accuracy architecture may be used for the terms scaled by $\{16, 32, 64\}$ instead of just the terms scaled by $\{32, 64\}$. Further, more than two different types of architectures may be used for different pop-counters or dot product engines used for more than two different subsets of the terms (e.g., a first accuracy for terms scaled by $\{32, 64\}$, a second accuracy for terms scaled by $\{8, 16\}$, a third accuracy for terms scaled by $\{1, 2, 4\}$). Still further, while FIG. 8 shows an example with 127b split pop-counters (e.g., for dot product engines 810-4 through 810-16) and 63b pop-counters (e.g., for dot product engines 810-1 through 810-3), this is not a requirement. The split pop-counters used for the relatively lower weighted sums-of-products may be 63b split pop-counters (e.g., where the additional capacitor bank includes 32 capacitors for inputs $x_{32}$, $w_{32}$ through $x_{62}$, $w_{62}$ rather than $x_{63}$, $w_{63}$ through $x_{126}$, $w_{126}$ as shown in the FIG. 7 example) and where the "regular" pop-counters used for the three highest weighted sums-of-products may be 32b pop-counters. Various other examples are possible.

In some embodiments, a mixed-signal multiply-accumulate circuit is designed which distinguishes between "critical" and "non-critical" computations within different dot-product computation engines, by sorting the dot-product computation engines by their noise contribution to a final result and selecting different accuracy circuit architectures for different sets of the dot-product engines (e.g., using the highest accuracy architectures for those dot-product computation engines which contribute the most noise to the final result, and using relatively lower accuracy architectures for the dot-product computation engines which contribute less noise to the final result). The different architectures used for the different subsets of the dot-product computation engines may be designed in various ways. For example, some embodiments provide the higher accuracy through performing critical bitwise dot products "accurately" (e.g., without additive quantization noise) while performing less critical bitwise dot products "approximately" (e.g., with additional quantization noise). Advantageously, the "approximate" computation of the less critical bitwise dot products may be achieved through the use of circuitry that provides power and/or area savings relative to the circuitry used for the "accurate" computation of the critical bitwise dot products.

In other embodiments, in addition to or in place of performing the critical bitwise dot products accurately (e.g., without additive quantization noise) while performing the less critical bitwise dot products approximately (e.g., with additional quantization noise), the circuitry used in the dot product engines performing the critical bitwise dot products may be designed with higher area and/or power consumption (e.g., with larger unit capacitor size, lower noise comparator, etc.) compared to the dot product engines performing the non-critical bitwise dot products. This ensures that the critical dot-products have lower computation errors (e.g., bit-errors) than the non-critical dot-products (e.g., as bit-errors may creep in due to thermal noise, manufacturing variations in unit capacitors, offsets, etc.).

Figure 9:
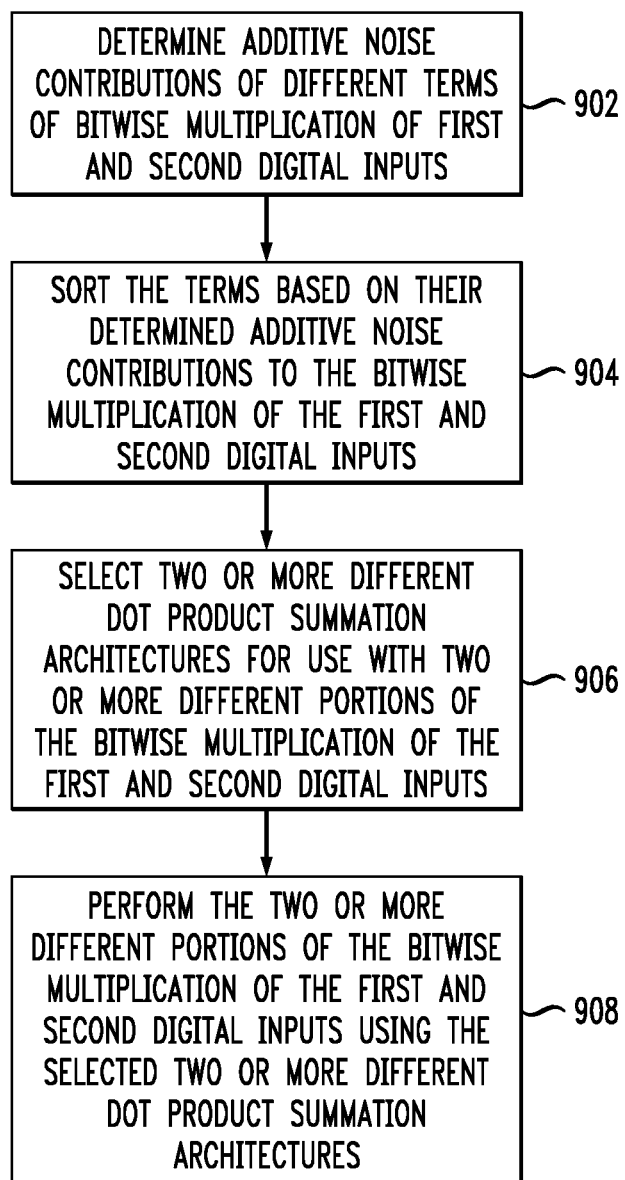
FIG. 9 depicts a methodology for performing low-noise mixed signal multiply-accumulate operations according to an illustrative embodiment.

FIG. 9 depicts a methodology 900 for performing low-noise mixed signal multiply-accumulate operations. The methodology 900 begins with step 902, determining additive noise contributions of different terms of bitwise multiplication of first and second digital inputs. FIGS. 4 and 5, for example, illustrate determining the additive noise contribution impacts of different terms for 63-bitwise multiplication of digital inputs $X_i$ and $W_i$. In step 904, the terms are sorted based on their determined additive noise contributions to the bitwise multiplication of the first and second digital inputs. In step 906, two or more different dot product summation architectures are selected for use with two or more different portions of the bitwise multiplication of the first and second digital inputs. For example, a first dot product summation architecture having a first accuracy may be selected for use with performing a first portion of the bitwise multiplication of the first and second digital inputs and at least a second dot product summation architecture having a second accuracy different than the first accuracy may be selected for use with performing a second portion of the bitwise multiplication of the first and second digital inputs. The first portion of the bitwise multiplication may include the k highest weighted sums-of-products of n total sums-of-products of the bitwise multiplication of the first and second digital inputs, while the second portion of the bitwise multiplication may include at least a portion of remaining n–k relatively lower weighted sums-of-products of the bitwise multiplication of the first and second digital inputs. In step 908, the two or more different portions of the bitwise multiplication of the first and second digital inputs is performed using the selected two or more different dot product summation architectures.

As noted above, there may be three or more different dot product summation architectures used for three or more different portions of the bitwise multiplication of the first and second digital inputs, and thus step 906 may include selecting three or more different dot product summation architectures for the three or more different portions of the bitwise multiplication of the first and second digital inputs. For example, the first portion may be for the k highest weighted sums-of-products of n total sums-of-products of the bitwise multiplication of the first and second digital inputs, the second portion may be for the l next highest weighted sums of products of the n total sums-of-products, and the third portion may be for the remaining n–k–l relatively lower weighted sums-of-products of the bitwise multiplication of the first and second digital inputs.

Figure 10:
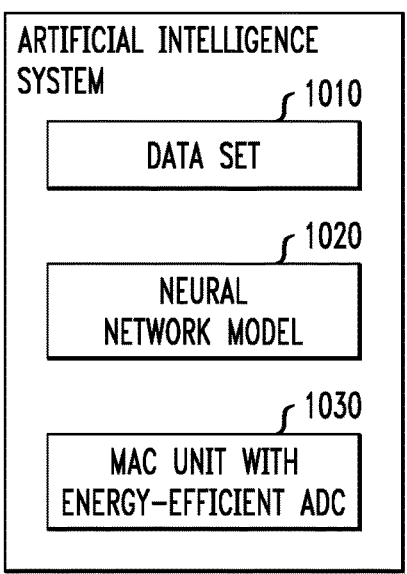
FIG. 10 depicts an exemplary implementation of an artificial intelligence system according to an illustrative embodiment.

FIG. 10 depicts an exemplary implementation of an artificial intelligence system 1000 according to an illustrative embodiment. As shown, system 1000 comprises a data set 1010, a neural network model 1020, and a MAC unit with low-noise ADC 1030. The MAC unit with low-noise ADC 1030 implements the use of architectures with different accuracies for critical and non-critical bitwise dot-product computations as described elsewhere herein, to perform computations for the neural network model 1020 utilizing the data set 1010, which may comprise training data in a training mode or inference data set in an inference mode.

In one exemplary embodiment, the artificial intelligence system 1000 is implemented by one or more application-specific integrated circuits (ASICs). ASICs are integrated circuit (IC) chips or devices customized for a particular purpose that comprise logic (e.g., circuitry, processors, memory, etc.) that are programmed with executable program code (e.g., instruction code, computer program code, etc.) or otherwise configured for the particular purpose. In this exemplary case, the particular purpose is the implementation and execution of an artificial intelligence system (e.g., machine learning algorithm). An ASIC is also considered a system-on-chip (SoC). Some ASIC implementations that can be used with one or more illustrative embodiments employ cell libraries of user selectable basic logic functions (e.g., a multiplexer, a comparator, etc. that are comprised of multiple VLSI transistor devices to provide various functions such as switching, comparing, etc.) to enable configuration (and reconfiguration) of the system.

It is to be further appreciated that artificial intelligence system 1000 and the parts thereof can be realized in alternative circuitry/processor-based technology such as technology including one or more multi-core central processing units (CPUs), one or more graphics processing units (GPUs), and one or more field programmable gate arrays (FPGAs). In some embodiments, artificial intelligence system 1000 can be implemented as a combination of two or more circuitry/processor-based technologies (e.g., ASIC, CPU, GPU, FPGA, etc.).

The techniques depicted in FIGS. 1-10 can also, as described herein, include providing a system, wherein the system includes distinct software modules, each of the distinct software modules being embodied on a tangible computer-readable recordable storage medium. All of the modules (or any subset thereof) can be on the same medium, or each can be on a different medium, for example. The modules can include any or all of the components shown in the figures and/or described herein. In an embodiment of the invention, the modules can run, for example, on a hardware processor. The method steps can then be carried out using the distinct software modules of the system, as described above, executing on a hardware processor. Further, a computer program product can include a tangible computer-readable recordable storage medium with code adapted to be executed to carry out at least one method step described herein, including the provision of the system with the distinct software modules.

Additionally, the techniques depicted in FIGS. 1-10 can be implemented via a computer program product that can include computer useable program code that is stored in a computer readable storage medium in a data processing system, and wherein the computer useable program code was downloaded over a network from a remote data processing system. Also, in an embodiment of the invention, the computer program product can include computer useable program code that is stored in a computer readable storage medium in a server data processing system, and wherein the computer useable program code is downloaded over a network to a remote data processing system for use in a computer readable storage medium with the remote system.

An embodiment of the invention or elements thereof can be implemented in the form of an apparatus including a memory and at least one processor that is coupled to the memory and configured to perform exemplary method steps.

In some embodiments, an apparatus comprises at least one processor and at least one memory including instruction code. The at least one memory and the instruction code are configured to, with the at least one processor, cause the apparatus at least to perform, with a first accuracy, a first portion of a bitwise multiplication of first and second digital inputs and to perform, with a second accuracy different than the first accuracy, at least a second portion of the bitwise multiplication of the first and second digital inputs.

The bitwise multiplication of the first and second digital inputs may comprise computation of a set of weighted sums of bitwise dot products of the first and second digital inputs, the first portion of the bitwise multiplication of the first and second digital inputs comprising a first subset of the set of weighted sums of the bitwise dot products of the first and second digital inputs, the second portion of the bitwise multiplication of the first and second digital inputs comprising a second subset of the set of weighted sums of the bitwise dot products of the first and second digital inputs. The set of weighted sums of the bitwise dot products of the first and digital inputs may comprise n weighted sums of the bitwise dot products of the first and second digital inputs, wherein the first portion of the bitwise multiplication performed with the first accuracy comprises computation of the k highest weighted sums of the bitwise dot products of the first and second digital inputs, and wherein the second portion of the bitwise multiplication performed with the second accuracy comprises computation of at least a portion of a remaining n–k weighted sums of the bitwise dot products of the first and second digital inputs. A value of k may be selected based at least in part on determining additive noise contributions of different terms of the bitwise multiplication of the first and second digital inputs.

The bitwise multiplication of the first and second digital inputs may be computed using one of a set of bitwise dot-product summation units, wherein the first accuracy is provided using a first type of hardware for a first subset of the set of bitwise dot-product summation units performing the first portion of the bitwise multiplication of the first and second digital inputs, and wherein the second accuracy is provided using a second type of hardware different than the first type of hardware for a second subset of the set of bitwise dot-product summation units performing the second portion of the bitwise multiplication of the first and second digital inputs.

Each of the set of bitwise dot-product summation units may comprise a pop-counter. The pop-counters of the first subset of the set of bitwise dot-product summation units may have a first resolution and the pop-counters of the second subset of the set of bitwise dot-product summation units may have a second resolution different than the first resolution.

Each of the set of bitwise dot-product summation units may comprise a pop-counter implemented utilizing a SAR ADC comprising a comparator. A first type of comparator utilized in the SAR ADC of the first subset of the set of bitwise dot-product summation units may have a first noise profile and a second type of comparator utilized in the SAR ADC of the second subset of the set of bitwise dot-product summation units may have a second noise profile different than the first noise profile. The first type of comparator utilized in the SAR ADC of the first subset of the set of bitwise dot-product computation units may also or alternatively have a first offset cancellation accuracy and a second type of comparator utilized in the SAR ADC of the second subset of the set of bitwise dot-product summation units may have a second offset cancellation accuracy different than the first offset cancellation accuracy.

Each of the set of bitwise dot-product summation units may comprise a pop-counter implemented utilizing a SAR ADC comprising a plurality of capacitors, and the plurality of capacitors utilized in the SAR ADC of the first subset of the set of bitwise dot-product summation units may have respective first sizes and the plurality of capacitors utilized in the SAR ADC of the second subset of the set of bitwise dot-product summation units may have respective second sizes different than the first sizes. The first subset of the set of bitwise dot-product computation units may also or alternatively comprise a single instance of the SAR ADC coupled to a plurality of additional capacitors summing a first number of inputs, and the second subset of the set of bitwise dot-product summation units may each comprise two or more instances of the SAR ADC each summing a second number of inputs less than the first number of inputs.

In some embodiments, a method of performing a multiply and accumulate operation comprises the steps of performing, with a first accuracy, a first portion of a bitwise multiplication of first and second digital inputs and performing, with a second accuracy different than the first accuracy, at least a second portion of the bitwise multiplication of the first and second digital inputs. The method is executed by processing circuitry configured to execute instruction code.

The bitwise multiplication of the first and second digital inputs may comprise computation of a set of weighted sums of bitwise dot products of the first and second digital inputs, the first portion of the bitwise multiplication of the first and second digital inputs comprising a first subset of the set of weighted sums of the bitwise dot products of the first and second digital inputs, and the second portion of the bitwise multiplication of the first and second digital inputs comprising a second subset of the set of weighted sums of the bitwise dot products of the first and second digital inputs. The set of weighted sums of the bitwise dot products of the first and digital inputs may comprise n weighted sums of the bitwise dot products of the first and second digital inputs, wherein the first portion of the bitwise multiplication performed with the first accuracy comprises computation of the k highest weighted sums of the bitwise dot products of the first and second digital inputs, and wherein the second portion of the bitwise multiplication performed with the second accuracy comprises computation of at least a portion of a remaining n–k weighted sums of the bitwise dot products of the first and second digital inputs.

In some embodiments, an article of manufacture comprises a non-transitory computer-readable storage medium having embodied therein executable instruction code that when executed by a processor causes the processor to perform the steps of performing, with a first accuracy, a first portion of a bitwise multiplication of first and second digital inputs and performing, with a second accuracy different than the first accuracy, at least a second portion of the bitwise multiplication of the first and second digital inputs.

The bitwise multiplication of the first and second digital inputs may comprise computation of a set of weighted sums of bitwise dot products of the first and second digital inputs, the first portion of the bitwise multiplication of the first and second digital inputs comprising a first subset of the set of weighted sums of the bitwise dot products of the first and second digital inputs, and the second portion of the bitwise multiplication of the first and second digital inputs comprising a second subset of the set of weighted sums of the bitwise dot products of the first and second digital inputs. The set of weighted sums of the bitwise dot products of the first and digital inputs may comprise n weighted sums of the bitwise dot products of the first and second digital inputs, wherein the first portion of the bitwise multiplication performed with the first accuracy comprises computation of the k highest weighted sums of the bitwise dot products of the first and second digital inputs, and wherein the second portion of the bitwise multiplication performed with the second accuracy comprises computation of at least a portion of a remaining n–k weighted sums of the bitwise dot products of the first and second digital inputs.

In some embodiments, a system comprises a multiply-accumulate unit configured to perform binary multiplication of first and second vectors. The multiply-accumulate unit comprises a set of two or more bitwise dot-product summation units each configured to perform bitwise multiplication of a portion of the first and second vectors to produce a digital output. Each bitwise dot-product summation unit of the set of two or more bitwise dot-product summation units comprises at least one instance of a bitwise dot-product computation unit coupled to an instance of a SAR ADC unit, the SAR ADC unit being configured to convert an analog output of the dot-product computation unit to at least a portion of the digital output. A first subset of the set of two or more bitwise dot-product summation units having a first accuracy are utilized for computing a first portion of the bitwise multiplication of the first and second vectors, and a second subset of the set of two or more bitwise dot-product summation units having a second accuracy different than the first accuracy are utilized for computing a second portion of the bitwise multiplication of the first and second vectors.

The bitwise multiplication of the first and second vectors may comprise computation of a set of weighted sums of bitwise dot products of the first and second vectors, wherein the first portion of the bitwise multiplication of the first and second vectors comprises a first subset of the set of weighted sums of the bitwise dot products of the first and second vectors, and wherein the second portion of the bitwise multiplication of the first and second vectors comprises a second subset of the set of weighted sums of the bitwise dot products of the first and second vectors. The set of weighted sums of the bitwise dot products of the first and second vectors may comprise n weighted sums of the bitwise dot products of the first and second vectors, wherein the first subset of the set of weighted sums of the bitwise dot products of the first and second vectors comprise the k highest weighted sums of the bitwise dot products of the first and second vectors, and wherein the second subset of the set of weighted sums of the bitwise dot products of the first and second vectors comprises at least a portion of a remaining n–k weighted sums of the bitwise dot products of the first and second vectors.

The system may be implemented as part of an artificial intelligence system, and/or as part of one or more integrated circuits.

In some embodiments, a device comprises multiply-accumulate circuitry configured to perform binary multiplication of first and second vectors. The multiply-accumulate circuitry comprises a set of two or more instances of bitwise dot-product summation circuitry each configured to perform bitwise multiplication of a portion of the first and second vectors to produce a digital output. Each instance of the bitwise dot-product summation circuitry of the set of two or more instances of the bitwise dot-product summation circuitry comprises at least one instance of bitwise dot-product computation circuitry coupled to at least one instance of SAR ADC circuitry, the SAR ADC circuitry being configured to convert an analog output of the bitwise dot-product computation circuitry to at least a portion of the digital output. A first subset of the set of two or more instances of the bitwise dot-product summation circuitry having a first accuracy are utilized for computing a first portion of the bitwise multiplication of the first and second vectors and a second subset of the set of two or more instances of the bitwise dot-product summation circuitry having a second accuracy different than the first accuracy are utilized for computing a second portion of the bitwise multiplication of the first and second vectors.

The bitwise multiplication of the first and second vectors may comprise computation of a set of weighted sums of bitwise dot products of the first and second vectors, wherein the first portion of the bitwise multiplication of the first and second vectors comprises a first subset of the set of weighted sums of the bitwise dot products of the first and second vectors, and wherein the second portion of the bitwise multiplication of the first and second vectors comprises a second subset of the set of weighted sums of the bitwise dot products of the first and second vectors. The set of weighted sums of the bitwise dot products of the first and second vectors may comprise n weighted sums of the bitwise dot products of the first and second vectors, wherein the first subset of the set of weighted sums of the bitwise dot products of the first and second vectors comprise the k highest weighted sums of the bitwise dot products of the first and second vectors, and wherein the second subset of the set of weighted sums of the bitwise dot products of the first and second vectors comprises at least a portion of a remaining n–k weighted sums of the bitwise dot products of the first and second vectors.

The first subset of the set of two or more instances of the bitwise dot-product summation circuitry may have a first resolution and the second subset of the two or more instances of the bitwise dot-product summation circuitry may have a second resolution different than the first resolution.

Each of the set of two or more instances of the bitwise dot-product summation circuitry may comprise a plurality of logical AND gates each receiving as input a first vector element of the first vector and a second vector element of the second vector, the plurality of logical AND gates having respective outputs coupled to first plates of a plurality of capacitors, and the plurality of capacitors in each of the first subset of the set of two or more instances of the bitwise dot-product summation circuitry may have respective first sizes and the plurality of capacitors in each of the second subset of the set of two or more instances of the bitwise dot-product summation circuitry may have respective second sizes different than the first sizes.

The SAR ADC circuitry of each of the set of two or more instances of the bitwise dot-product summation circuitry may comprise a comparator, wherein a first type of comparator utilized in the SAR ADC circuitry of the first subset of the set of two or more instances of the bitwise dot-product summation circuitry is different than a second type of comparator utilized in the SAR ADC circuitry of the second subset of the set of two or more instances of the bitwise dot-product summation circuitry. The first type of comparator may have a first noise profile and the second type of comparator may have a second noise profile different than the first noise profile. The first type of comparator may also or alternatively have a first offset cancellation accuracy and the second type of comparator may have a second offset cancellation accuracy different than the first offset cancellation accuracy.

Each instance of the bitwise dot-product summation circuitry in the first subset of the set of two or more instances of the bitwise dot-product summation circuitry may comprise at least two instances of the bitwise dot-product computation circuitry and the SAR ADC circuitry, and each instance of the bitwise dot-product summation circuitry in the second subset of the two or more instances of the bitwise dot-product summation circuitry may comprise a single instance of the bitwise dot-product computation circuitry and the SAR ADC circuitry coupled to an additional capacitor bank. Each of the at least two instances of the bitwise dot-product computation circuitry and the SAR ADC circuitry of each instance of the bitwise dot-product summation circuitry in the first subset of the set of two or more instances of the bitwise dot-product summation circuitry may sum a first number of inputs, and each of the single instance of the bitwise dot-product computation circuitry and the SAR ADC circuitry coupled to the additional capacitor bank of each instance of the bitwise dot-product summation circuitry in the second subset of the set of two or more instances of the bitwise dot-product summation circuitry may sum a second number of inputs greater than the first number of inputs.

Additionally, an embodiment of the present invention can make use of software running on a computer or workstation.

Figure 11:
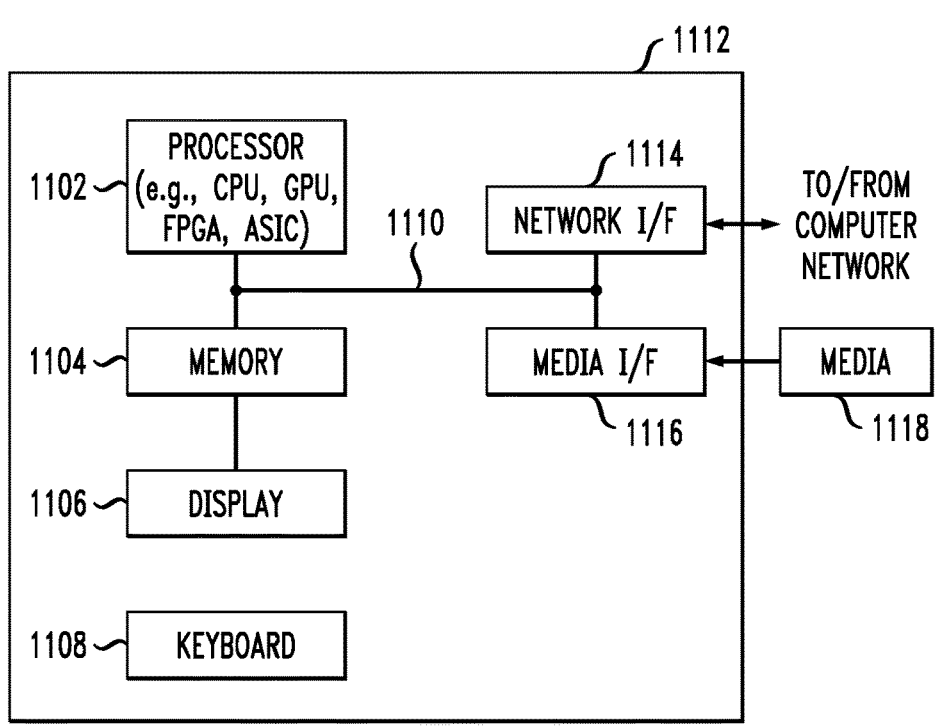
FIG. 11 depicts an exemplary processor system according to an illustrative embodiment.

With reference to FIG. 11, such an implementation might employ, for example, a processor 1102, a memory 1104, and an input/output interface formed, for example, by a display 1106 and a keyboard 1108. The term "processor" as used herein is intended to include any processing device, such as, for example, one that includes a multi-core CPU, GPU, FPGA and/or other forms of processing circuitry such as one or more ASICs. Further, the term "processor" may refer to more than one individual processor. The term "memory" is intended to include memory associated with a processor (e.g., CPU, GPU, FPGA, ASIC, etc.) such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, a mechanism for inputting data to the processing unit (for example, mouse), and a mechanism for providing results associated with the processing unit (for example, printer). The processor 1102, memory 1104, and input/output interface such as display 1106 and keyboard 1108 can be interconnected, for example, via bus 1110 as part of a data processing unit 1112. Suitable interconnections, for example via bus 1110, can also be provided to a network interface 1114, such as a network card, which can be provided to interface with a computer network, and to a media interface 1116, such as a diskette or CD-ROM drive, which can be provided to interface with media 1118.

Accordingly, computer software including instructions or code for performing the methodologies of the invention, as described herein, may be stored in associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 1102 coupled directly or indirectly to memory elements 1104 through a system bus 1110. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including, but not limited to, keyboards 1108, displays 1106, pointing devices, and the like) can be coupled to the system either directly (such as via bus 1110) or through intervening I/O controllers (omitted for clarity).

Network adapters such as network interface 1114 may also be coupled to the system to enable the data processing system to become coupled to other data processing systems or remote printers or storage devices through intervening private or public networks. Modems, cable modems and Ethernet cards are just a few of the currently available types of network adapters.

As used herein, including the claims, a "server" includes a physical data processing system (for example, system 1112 as shown in FIG. 11) running a server program. It will be understood that such a physical server may or may not include a display and keyboard.

The present invention may be a system, a method, and/or a computer program product at any possible technical detail level of integration. The computer program product may include a computer readable storage medium (or media)

having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random-access memory (RAM), a read-only memory (ROM), an erasable programmable read-only memory (EPROM or Flash memory), an SRAM, a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that any of the methods described herein can include an additional step of providing a system comprising distinct software modules embodied on a computer readable storage medium; the modules can include, for example, any or all of the components detailed herein. The method steps can then be carried out using the distinct software modules and/or sub-modules of the system, as described above, executing on a hardware processor 1102. Further, a computer program product can include a computer-readable storage medium with code adapted to be implemented to carry out at least one method step described herein, including the provision of the system with the distinct software modules.

In any case, it should be understood that the components illustrated herein may be implemented in various forms of hardware, software, or combinations thereof, for example, application specific integrated circuit(s) (ASICs), functional circuitry, an appropriately programmed digital computer with associated memory, and the like. Given the teachings of the invention provided herein, one of ordinary skill in the related art will be able to contemplate other implementations of the components of the invention.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (for example, country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (for example, storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (for example, web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (for example, host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (for example, mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (for example, cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 12:
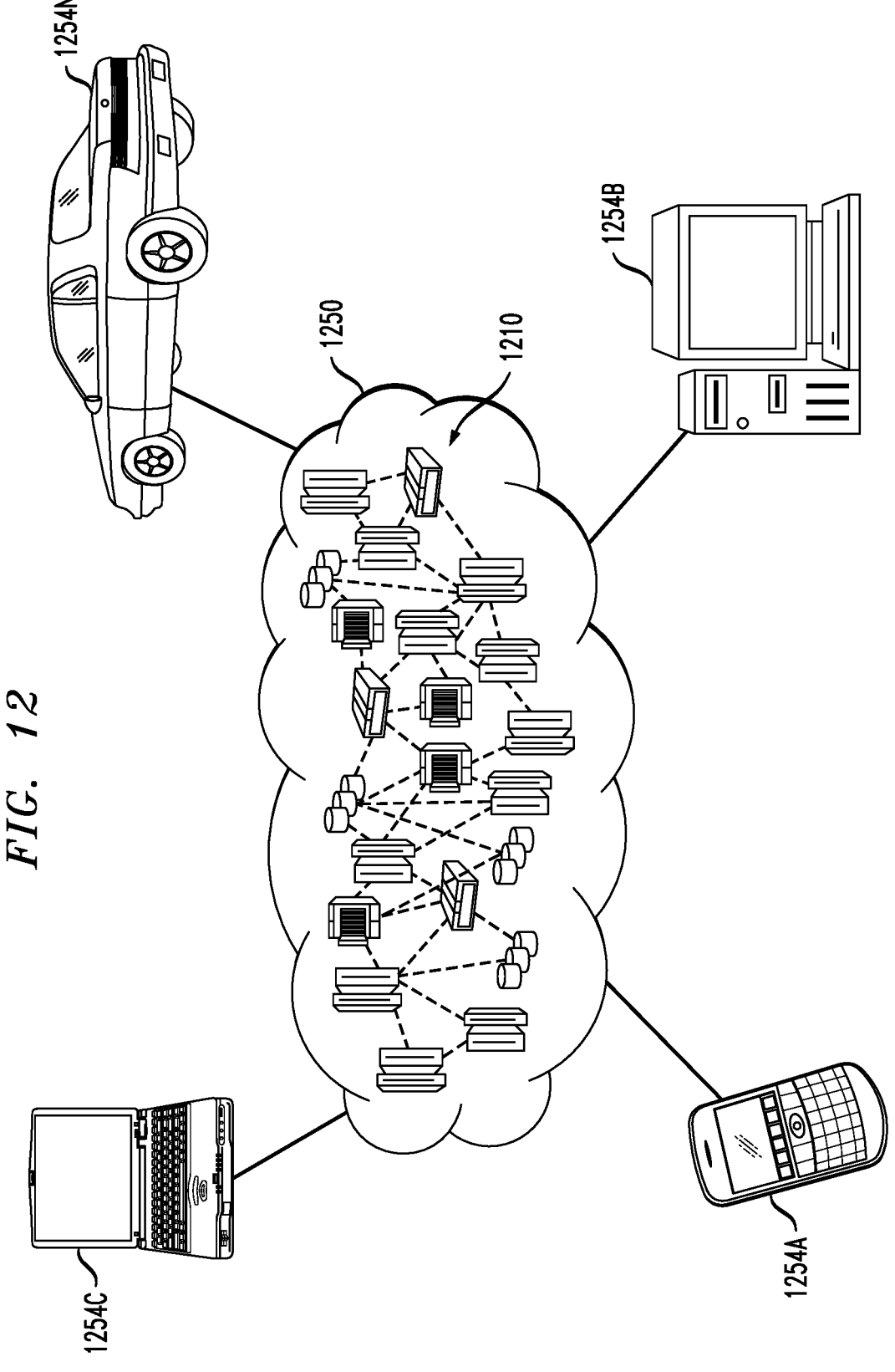
FIG. 12 depicts a cloud computing environment according to an illustrative embodiment.

Referring now to FIG. 12, illustrative cloud computing environment 1250 is depicted. As shown, cloud computing environment 1250 includes one or more cloud computing nodes 1210 with which local computing devices used by cloud consumers, such as, for example, personal digital assistant (PDA) or cellular telephone 1254A, desktop computer 1254B, laptop computer 1254C, and/or automobile computer system 1254N may communicate. Nodes 1210 may communicate with one another. They may be grouped (not shown) physically or virtually, in one or more networks, such as Private, Community, Public, or Hybrid clouds as described hereinabove, or a combination thereof. This allows cloud computing environment 1250 to offer infrastructure, platforms and/or software as services for which a cloud consumer does not need to maintain resources on a local computing device. It is understood that the types of computing devices 1254A-N shown in FIG. 12 are intended to be illustrative only and that computing nodes 1210 and cloud computing environment 1250 can communicate with any type of computerized device over any type of network and/or network addressable connection (e.g., using a web browser).

Figure 13:
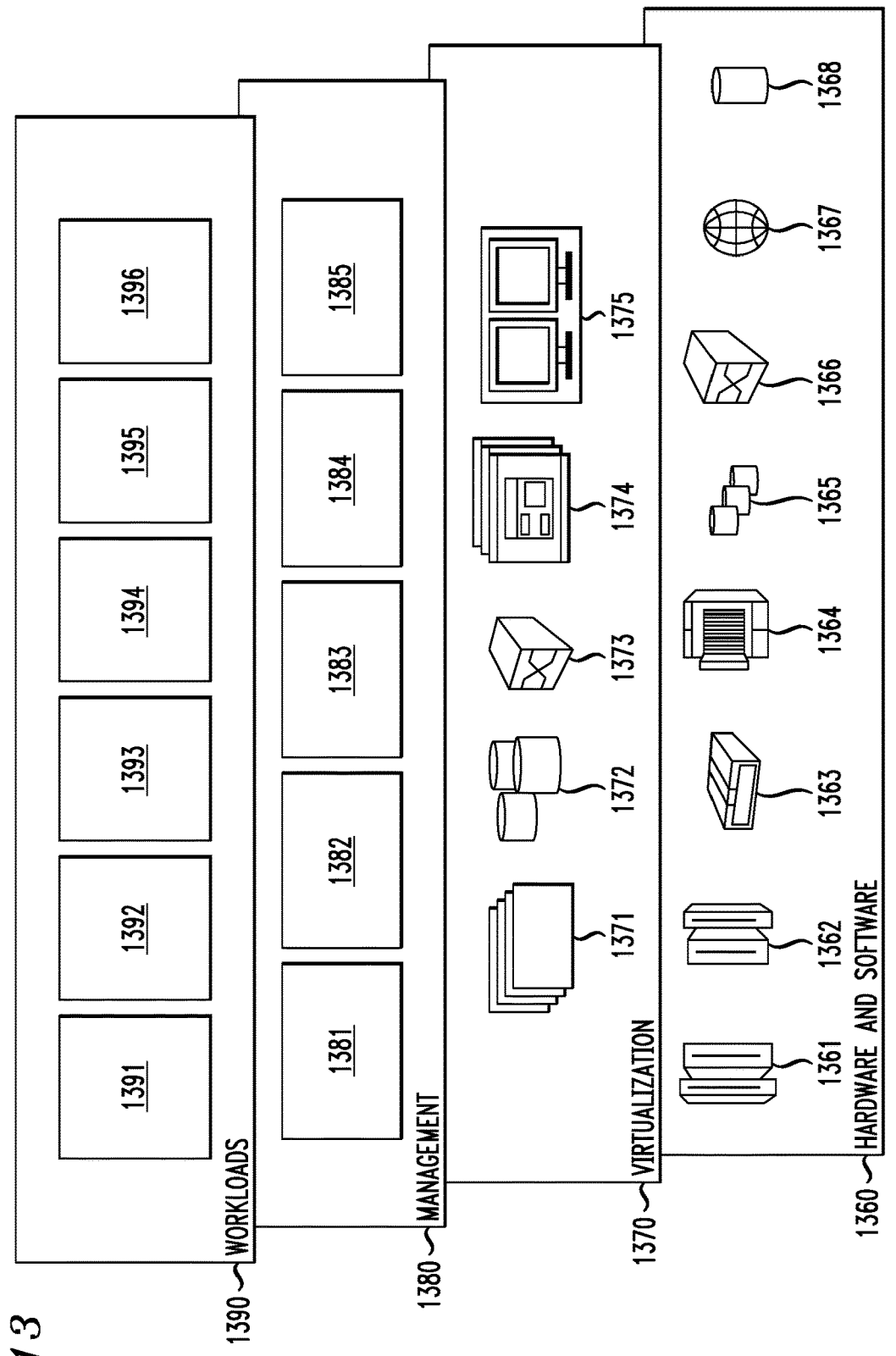
FIG. 13 depicts abstraction model layers according to an illustrative embodiment.

Referring now to FIG. 13, a set of functional abstraction layers provided by cloud computing environment 1250 (FIG. 12) is shown. It should be understood in advance that the components, layers, and functions shown in FIG. 13 are intended to be illustrative only and embodiments of the invention are not limited thereto. As depicted, the following layers and corresponding functions are provided:

Hardware and software layer 1360 includes hardware and software components. Examples of hardware components include: mainframes 1361; RISC (Reduced Instruction Set Computer) architecture-based servers 1362; servers 1363; blade servers 1364; storage devices 1365; and networks and networking components 1366. In some embodiments, software components include network application server software 1367 and database software 1368.

Virtualization layer 1370 provides an abstraction layer from which the following examples of virtual entities may be provided: virtual servers 1371; virtual storage 1372; virtual networks 1373, including virtual private networks; virtual applications and operating systems 1374; and virtual clients 1375.

In one example, management layer 1380 may provide the functions described below. Resource provisioning 1381 provides dynamic procurement of computing resources and other resources that are utilized to perform tasks within the cloud computing environment. Metering and Pricing 1382 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1383 provides access to the cloud computing environment for consumers and system administrators. Service level management 1384 provides cloud computing resource allocation and management such that required service levels are met. Service Level Agreement (SLA) planning and fulfillment 1385 provide pre-arrangement for, and procurement of, cloud computing resources for which a future requirement is anticipated in accordance with an SLA.

Workloads layer 1390 provides examples of functionality for which the cloud computing environment may be utilized. Examples of workloads and functions which may be provided from this layer include: mapping and navigation 1391; software development and lifecycle management 1392; virtual classroom education delivery 1393; data analytics processing 1394; transaction processing 1395; and artificial intelligence algorithm (with low-noise MS-DPE/MS-MAC computations) processing 1396, in accordance with the one or more embodiments of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of another feature, step, operation, element, component, and/or group thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:

multiply-accumulate circuitry, the multiply-accumulate circuitry comprising a set of two or more instances of bitwise dot-product summation circuitry, a first subset of the set of two or more instances of the bitwise dot-product summation circuitry utilizing first analog hardware and a second subset of the set of two or more instances of the bitwise dot-product summation circuitry utilizing second analog hardware, the second analog hardware being different than the first analog hardware;

at least one processor; and at least one memory including instruction code;

the at least one memory and the instruction code being configured to, with the at least one processor, cause the apparatus at least to:

perform, with a first accuracy, a first portion of a bitwise multiplication of first and second digital inputs using the first analog hardware; and perform, with a second accuracy different than the first accuracy, at least a second portion of the bitwise multiplication of the first and second digital inputs using the second analog hardware;

wherein the first analog hardware comprises two or more pop-counter circuit instances each configured to sum a first number of inputs utilizing a bit-design of a first number of bits; and wherein the second analog hardware comprises a single pop-counter circuit instance coupled to an additional capacitor bank configured to sum a second number of inputs utilizing the bit-design of the first number of bits, the second number of inputs being greater than the first number of inputs.

2. The apparatus of claim 1, wherein the bitwise multiplication of the first and second digital inputs comprises computation of a set of weighted sums of bitwise dot products of the first and second digital inputs, wherein the first portion of the bitwise multiplication of the first and second digital inputs comprises a first subset of the set of weighted sums of the bitwise dot products of the first and second digital inputs, and wherein the second portion of the bitwise multiplication of the first and second digital inputs comprises a second subset of the set of weighted sums of the bitwise dot products of the first and second digital inputs.

3. The apparatus of claim 2, wherein the set of weighted sums of the bitwise dot products of the first and second digital inputs comprises n weighted sums of the bitwise dot products of the first and second digital inputs, wherein the first portion of the bitwise multiplication performed with the first accuracy comprises computation of the k highest weighted sums of the bitwise dot products of the first and second digital inputs, and wherein the second portion of the bitwise multiplication performed with the second accuracy comprises computation of at least a portion of a remaining n–k weighted sums of the bitwise dot products of the first and second digital inputs.

4. The apparatus of claim 3, wherein a value of k is selected at least in part on determining additive noise contributions of different terms of the bitwise multiplication of the first and second digital inputs.

5. The apparatus of claim 1, wherein each of the two or more pop-counter circuit instances of the first analog hardware has a first resolution and the single pop-counter circuit instance of the second analog hardware has a second resolution different than the first resolution.

6. The apparatus of claim 1, wherein each of the two or more pop-counter circuit instances of the first analog hardware comprises a successive approximation register analog-to-digital converter comprising a first type of comparator, wherein the single pop-counter circuit instance of the second analog hardware comprises a successive approximation register analog-to-digital converter comprising a second type of comparator, wherein the first type of comparator is different than the second type of comparator.

7. The apparatus of claim 6, wherein at least one of:

the first type of comparator has a first noise profile and the second type of comparator has a second noise profile different than the first noise profile; and the first type of comparator has a first offset cancellation accuracy and the second type of comparator has a second offset cancellation accuracy different than the first offset cancellation accuracy.

8. The apparatus of claim 1, wherein each of the two or more pop-counter circuit instances of the first analog hardware comprises a successive approximation register analog-to-digital converter comprising a first plurality of capacitors having respective first sizes, and wherein the single pop-counter circuit instance of the second analog hardware comprises a successive approximation register analog-to-digital converter comprises a second plurality of capacitors having respective second sizes different than the first sizes.

9. The apparatus of claim 1, wherein the first analog hardware comprises a first number of charge-sharing capacitors and the second analog hardware comprises a second number of charge-sharing capacitors, the second number of charge-sharing capacitors being different than the first number of charge-sharing capacitors.

10. The apparatus of claim 1, wherein the first analog hardware comprises a first set of charge-sharing capacitors with a first size and the second analog hardware comprises a second set of charge-sharing capacitors with a second size, the second size being different than the first size.

11. The apparatus of claim 1, wherein the first analog hardware comprises a first comparator with a first noise profile and the second analog hardware comprises a second comparator with a second noise profile, the second noise profile being different than the first noise profile.

12. The apparatus of claim 1, wherein the first analog hardware comprises a first comparator with a first offset cancellation and the second analog hardware comprises a second comparator with a second offset cancellation, the second offset cancellation being different than the first offset cancellation.

13. The apparatus of claim 1 wherein the single pop-counter circuit instance of the second analog hardware is coupled to the additional capacitor bank via a switch, the switch being closed in a first mode of operation for a summation operating phase and being open in a second mode of operation for a successive approximation register phase.

14. A method, comprising the steps of:

performing, with a first accuracy, a first portion of a bitwise multiplication of first and second digital inputs using a first subset of a set of two or more instances of bitwise dot-product summation circuitry, the first subset of the set of two or more instance of the bitwise dot-product summation circuitry utilizing first analog hardware; and performing, with a second accuracy different than the first accuracy, at least a second portion of the bitwise multiplication of the first and second digital inputs using a second subset of the set of two or more instances of the bitwise dot-product summation circuitry, the second subset of the set of two or more instances of the bitwise dot-product summation circuitry utilizing second analog hardware, the second analog hardware being different than the first analog hardware;

wherein the method is executed by processing circuitry configured to execute instruction code;

wherein the first analog hardware comprises two or more pop-counter circuit instances each configured to sum a first number of inputs utilizing a bit-design of a first number of bits; and wherein the second analog hardware comprises a single pop-counter circuit instance coupled to an additional capacitor bank configured to sum a second number of inputs utilizing the bit-design of the first number of bits, the second number of inputs being greater than the first number of inputs.

15. The method of claim 14, wherein the bitwise multiplication of the first and second digital inputs comprises computation of a set of weighted sums of bitwise dot products of the first and second digital inputs, wherein the first portion of the bitwise multiplication of the first and second digital inputs comprises a first subset of the set of weighted sums of the bitwise dot products of the first and second digital inputs, and wherein the second portion of the bitwise multiplication of the first and second digital inputs comprises a second subset of the set of weighted sums of the bitwise dot products of the first and second digital inputs.

16. An article of manufacture comprising a non-transitory computer-readable storage medium having embodied therein executable instruction code that when executed by a processor causes the processor to perform the steps of:

performing, with a first accuracy, a first portion of a bitwise multiplication of first and second digital inputs using a first subset of a set of two or more instances of bitwise dot-product summation circuitry, the first subset of the set of two or more instance of the bitwise dot-product summation circuitry utilizing first analog hardware; and performing, with a second accuracy different than the first accuracy, at least a second portion of the bitwise multiplication of the first and second digital inputs using a second subset of the set of two or more instances of the bitwise dot-product summation circuitry, the second subset of the set of two or more instances of the bitwise dot-product summation circuitry utilizing second analog hardware, the second analog hardware being different than the first analog hardware;

wherein the first analog hardware comprises two or more pop-counter circuit instances each configured to sum a first number of inputs utilizing a bit-design of a first number of bits; and wherein the second analog hardware comprises a single pop-counter circuit instance coupled to an additional capacitor bank configured to sum a second number of inputs utilizing the bit-design of the first number of bits, the second number of inputs being greater than the first number of inputs.

17. The article of claim 16, wherein the bitwise multiplication of the first and second digital inputs comprises computation of a set of weighted sums of bitwise dot products of the first and second digital inputs, wherein the first portion of the bitwise multiplication of the first and second digital inputs comprises a first subset of the set of weighted sums of the bitwise dot products of the first and second digital inputs, and wherein the second portion of the bitwise multiplication of the first and second digital inputs comprises a second subset of the set of weighted sums of the bitwise dot products of the first and second digital inputs.

* * * * *